US012563784B2

(12) United States Patent
Lee et al.

(10) Patent No.: US 12,563,784 B2
(45) Date of Patent: Feb. 24, 2026

(54) SEMICONDUCTOR DEVICE

(71) Applicant: SAMSUNG ELECTRONICS CO., LTD., Suwon-si (KR)

(72) Inventors: Jaehyun Lee, Suwon-si (KR); Jonghan Lee, Suwon-si (KR); Jonghoon Baek, Suwon-si (KR); Taegon Kim, Suwon-si (KR); Yujin Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 396 days.

(21) Appl. No.: 18/199,133

(22) Filed: May 18, 2023

(65) Prior Publication Data

US 2024/0030305 A1     Jan. 25, 2024

(30) Foreign Application Priority Data

Jul. 21, 2022     (KR) ........................ 10-2022-0089981

(51) Int. Cl.
| | |
|---|---|
| *H01L 29/423* | (2006.01) |
| *H01L 29/06* | (2006.01) |
| *H01L 29/775* | (2006.01) |
| *H01L 29/786* | (2006.01) |
| *H10D 30/43* | (2025.01) |
| *H10D 30/67* | (2025.01) |
| *H10D 62/10* | (2025.01) |

(52) U.S. Cl.
CPC ......... *H10D 30/6735* (2025.01); *H10D 30/43* (2025.01); *H10D 30/6757* (2025.01); *H10D 62/121* (2025.01)

(58) Field of Classification Search
CPC ............... H10D 30/6735; H10D 30/43; H10D 30/6757; H10D 62/121; H10D 84/0156; H10D 84/0128; H10D 84/0135; H10D 84/0151; H10D 84/83
USPC ........................................................ 257/288
See application file for complete search history.

(56) References Cited

U.S. PATENT DOCUMENTS

| | | | |
|---|---|---|---|
| 7,402,483 B2 | 7/2008 | Yun et al. | |
| 10,896,955 B2 | 1/2021 | Lim et al. | |
| 2018/0145131 A1 | 5/2018 | Wang et al. | |
| 2020/0135848 A1* | 4/2020 | Lim ................... | H10D 84/0167 |
| 2021/0020636 A1* | 1/2021 | Lee .................... | H10D 84/0193 |

* cited by examiner

*Primary Examiner* — Tong-Ho Kim
(74) *Attorney, Agent, or Firm* — Sughrue Mion, PLLC

(57) ABSTRACT

The present disclosure provides for semiconductor devices including field effect transistors. In some embodiments, the semiconductor device includes active structures extending in a first direction on a substrate, an isolation pattern formed in a trench between the active structures, gate structures extending in a second direction across the active structures, a cutting insulation pattern formed between end portions of the gate structures in the second direction, and a lower impurity region at an upper portion of the isolation pattern. A first shape of a lower portion of the cutting insulation pattern disposed under an uppermost surface of the isolation pattern is different from a second shape of a lower portion of the gate structures disposed under the uppermost surface of the isolation pattern. The gate structures are formed on the active structures and the isolation pattern. The lower impurity region contacts at least a portion of the cutting insulation pattern.

18 Claims, 25 Drawing Sheets

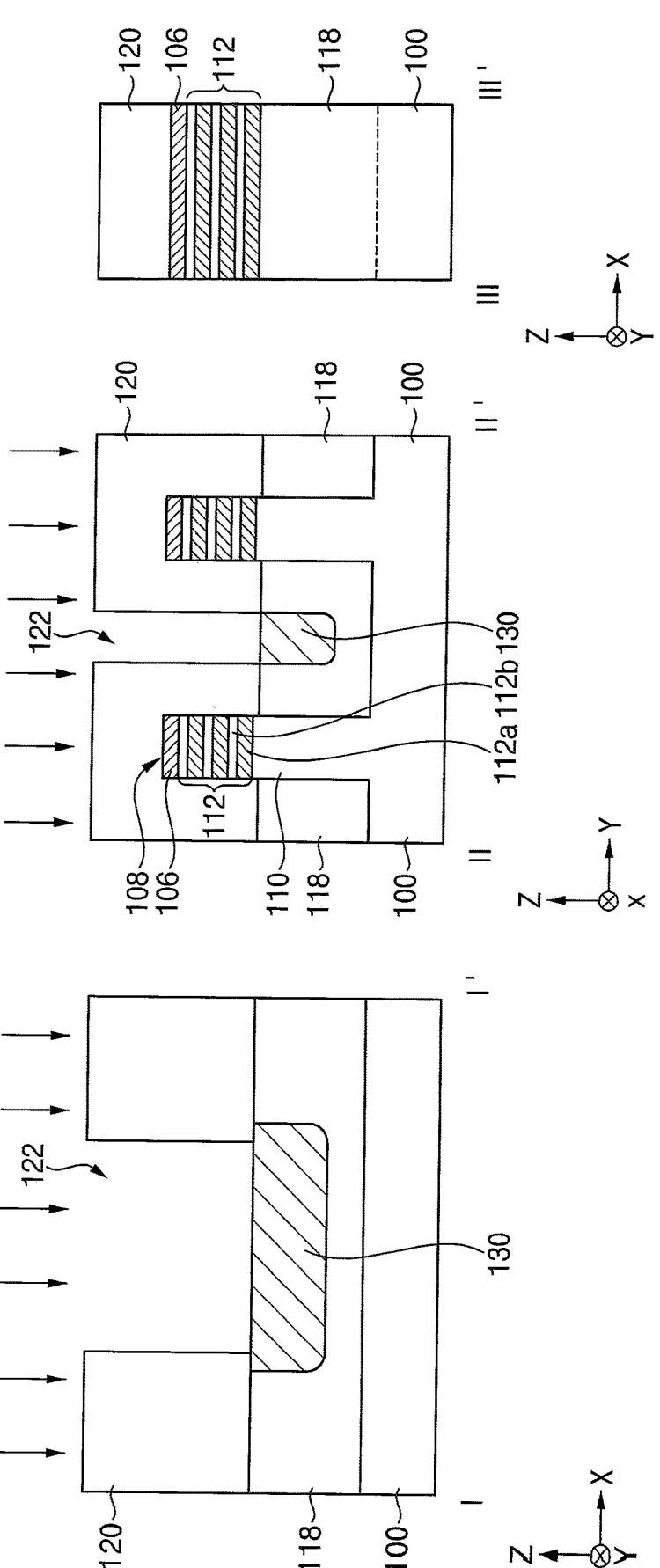
F I G. 7

F I G. 14
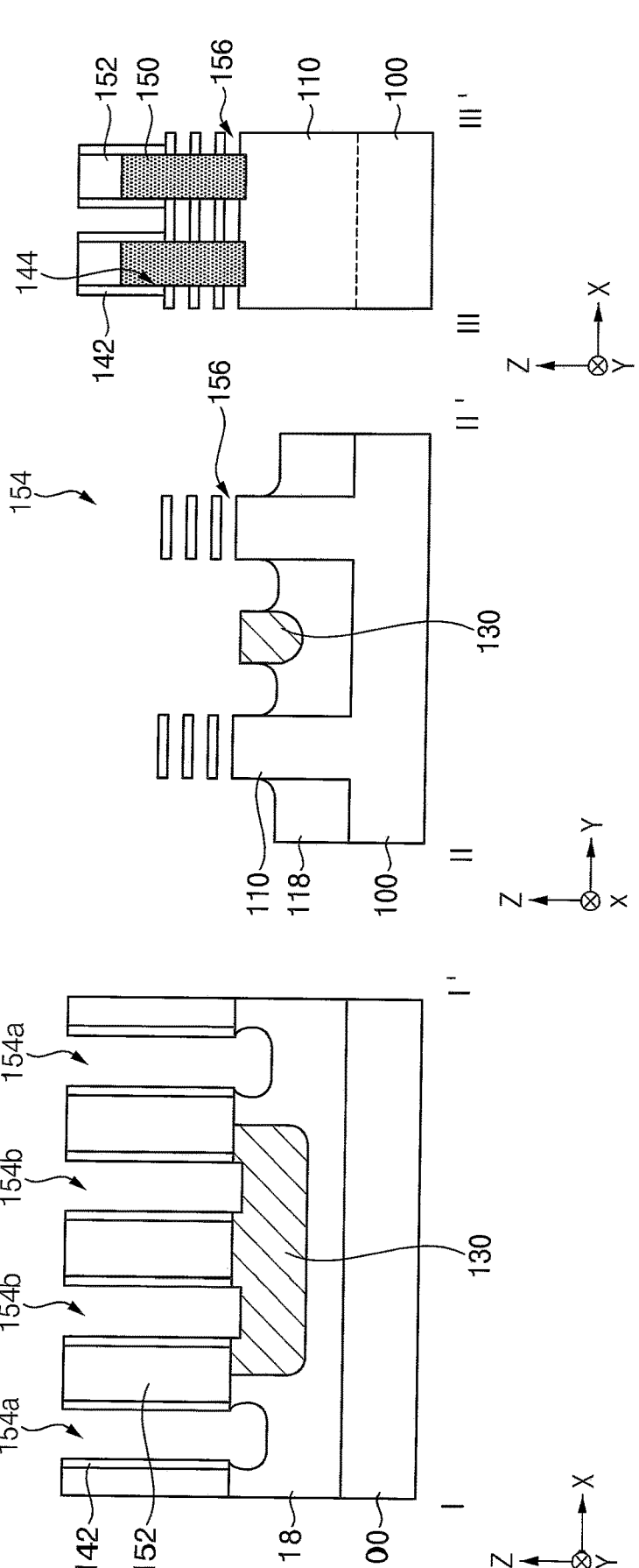

F I G.  17
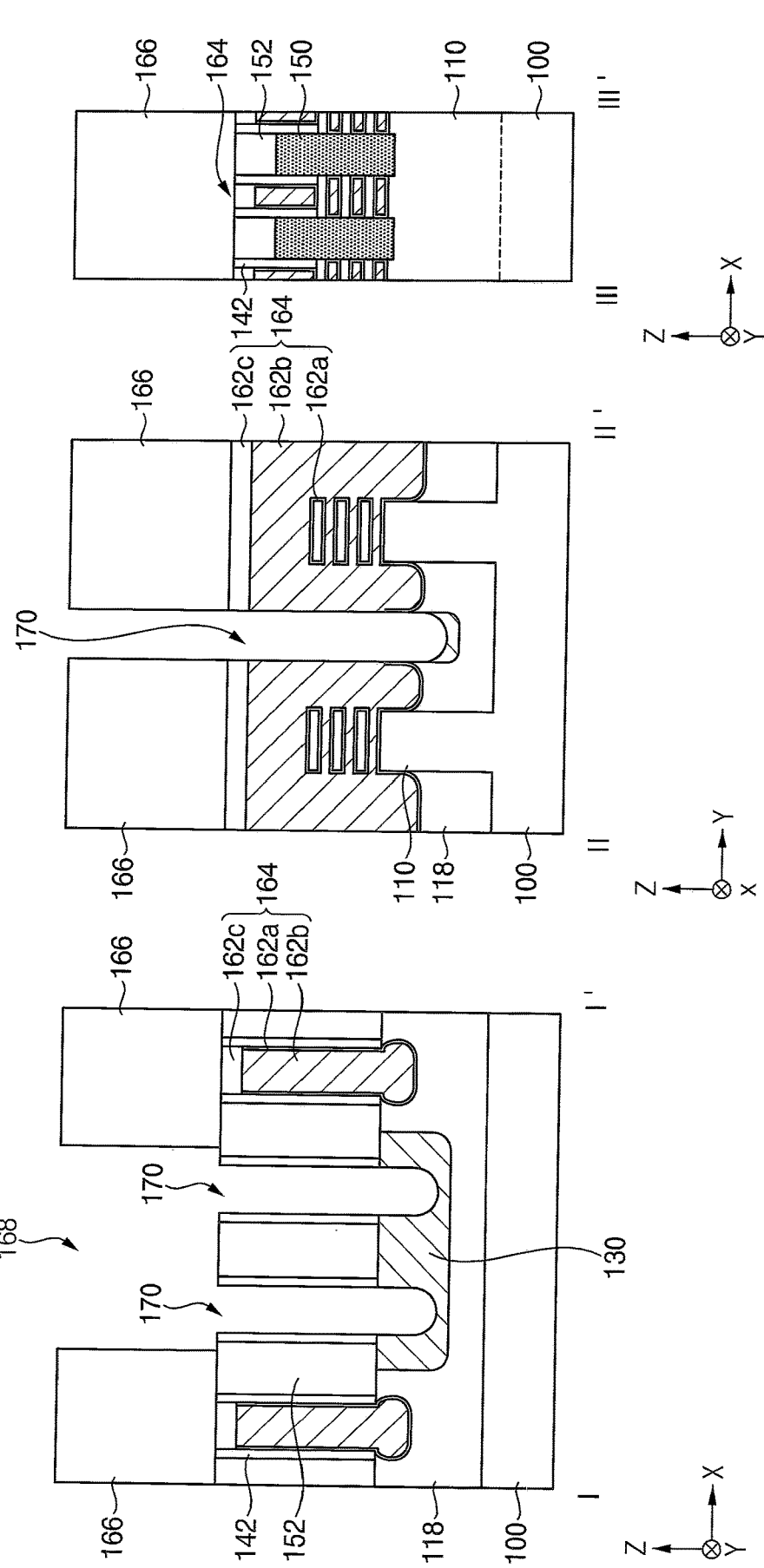

SEMICONDUCTOR DEVICE

CROSS-REFERENCE TO RELATED APPLICATION

This application claims benefit of priority under 35 USC § 119 to Korean Patent Application No. 10-2022-0089981, filed on Jul. 21, 2022, in the Korean Intellectual Property Office, the disclosure of which is incorporated by reference herein in its entirety.

BACKGROUND

1. Field

The present disclosure generally relates to a semiconductor device, and more particularly, to a semiconductor device including field effect transistors (FETs).

2. Description of the Related Art

Multi-bridge channel field effect transistors (MBCFETs) including a plurality of vertically stacked channels have been developed. The MBCFETs may be formed to have target electrical characteristics.

There exists a need for further improvements in semiconductor devices, as the need for semiconductor devices including FETs (e.g., MBCFETs) may be constrained by electrical characteristics.

SUMMARY

The present disclosure provides a semiconductor device including field effect transistors (FETs) having target electrical characteristics.

According to an aspect of the present disclosure, a semiconductor device is provided. The semiconductor device includes active structures extending in a first direction on a substrate, an isolation pattern formed in a trench between the active structures, gate structures extending in a second direction across the active structures, a cutting insulation pattern formed between end portions of the gate structures in the second direction, and a lower impurity region at an upper portion of the isolation pattern. The lower impurity region contacts at least a portion of the cutting insulation pattern. The gate structures are formed on the active structures and the isolation pattern. The second direction is perpendicular to the first direction. A first shape of a lower portion of the cutting insulation pattern disposed under an uppermost surface of the isolation pattern is different from a second shape of a lower portion of the gate structures disposed under the uppermost surface of the isolation pattern.

According to an aspect of the present disclosure, a semiconductor device is provided. The semiconductor device includes lower active patterns protruding from a surface of a substrate surface, a channel structure on each of the lower active patterns, impurity region structures on each of the lower active patterns, an isolation pattern formed in a trench between the lower active patterns, gate structures on the isolation pattern while surrounding the channel structure, a cutting insulation pattern formed between end portions of the gate structures in the second direction, and a lower impurity region formed at an upper portion of the isolation pattern. The lower impurity region contacts at least a portion of the cutting insulation pattern. The lower active patterns extend in a first direction. The channel structure includes semiconductor patterns spaced apart from each other in a vertical direction. The vertical direction is perpendicular to an upper surface of the lower active patterns. The impurity region structures are formed on both sidewalls of the channel structure. The gate structures extend in a second direction. The second direction is perpendicular to the first direction. A bottom of the gate structures disposed on the isolation pattern is lower than an uppermost surface of the lower impurity region.

According to an aspect of the present disclosure, a semiconductor device is provided. The semiconductor device includes active structures extending in a first direction on a substrate, an isolation pattern formed in a trench between the active structures, gate structures extending in a second direction across the active structures, and a cutting insulation pattern formed between end portions of the gate structures in the second direction. The cutting insulation pattern extends to an upper portion of the isolation pattern. The gate structures are formed on the active structures and the isolation pattern. The second direction is perpendicular to the first direction. A first shape of a lower portion of the cutting insulation pattern disposed under the uppermost surface of the isolation pattern is different from a second shape of a lower portion of the gate structures disposed on the isolation pattern. A bottom of the gate structures disposed on the isolation pattern is lower than an uppermost surface of a lower impurity region.

In example embodiments, the semiconductor device may include the lower impurity region contacting the cutting insulation pattern, and a lower portion of the cutting insulation pattern may have a shape different from that of a lower portion of the gate structure. Accordingly, a defect in which the gate structures on both sides of the cutting insulation pattern are electrically connected to each other may be reduced.

Additional aspects will be set forth in part in the description that follows and, in part, will be apparent from the description, or may be learned by practice of the presented embodiments of the disclosure.

BRIEF DESCRIPTION OF DRAWINGS

The above and other aspects, features, and advantages of certain embodiments of the present disclosure will be more apparent from the following description taken in conjunction with the accompanying drawings, in which:

FIGS. 5 to 19 are cross-sectional views and plan views illustrating a method of manufacturing a semiconductor device, in accordance with example embodiments;

DETAILED DESCRIPTION

Figure 1:
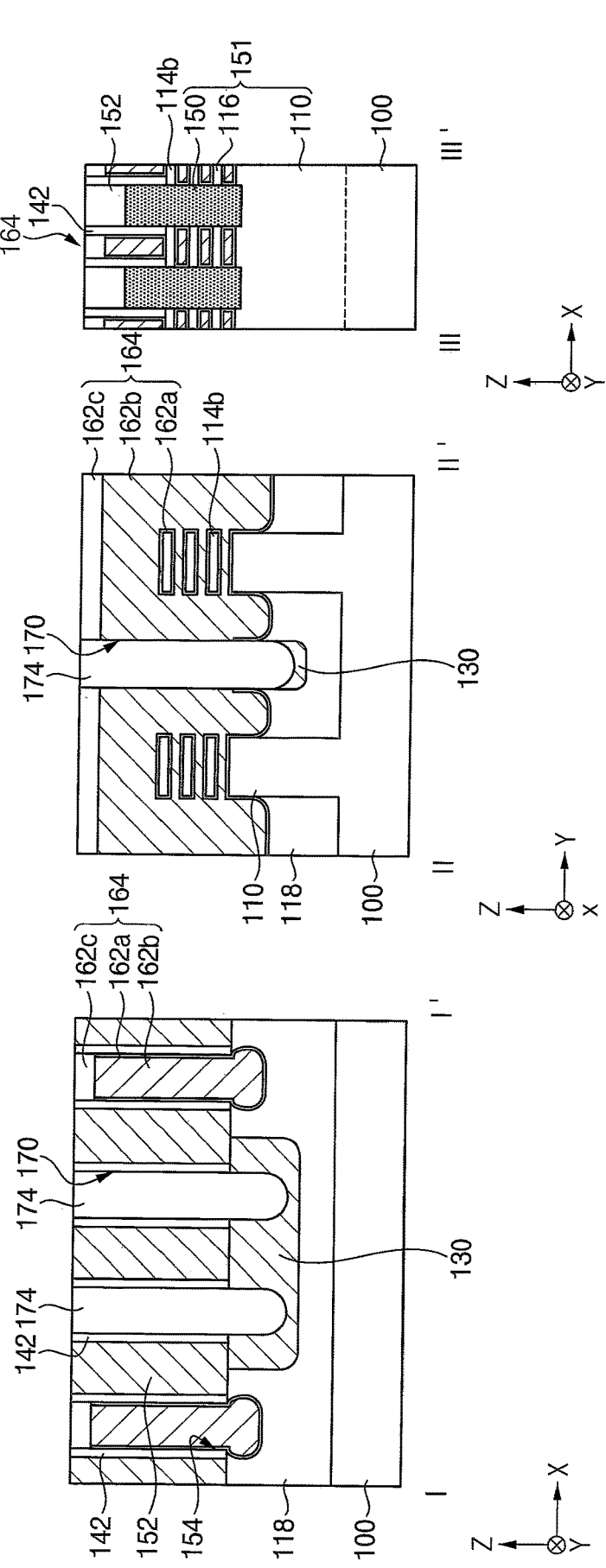
FIGS. 1 and 2 are a cross-sectional view and a plan view illustrating a semiconductor device, in accordance with example embodiments.

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art will recognize that various changes and modifications of the embodiments described herein can be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise. As used herein, expressions such as "at least one of" when preceding a list of elements, modify the entire list of elements and do not modify the individual elements of the list. For example, "at least one of a, b, and c" should be understood as including only a, only b, only c, both a and b, both a and c, both b and c, or all of a, b, and c. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

The terms "upper," "middle", "lower", etc. may be replaced with terms, such as "first," "second," third" to be used to describe relative positions of elements. The terms "first," "second," third" may be used to described various elements but the elements are not limited by the terms and a "first element" may be referred to as a "second element". Alternatively or additionally, the terms "first", "second", "third", etc. may be used to distinguish components from each other and do not limit the present disclosure. For example, the terms "first", "second", "third", etc. may not necessarily involve an order or a numerical meaning of any form.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment.

Hereinafter, embodiments of the present disclosure are described with reference to the accompanying drawings.

Hereinafter, a direction parallel to a surface of a substrate surface may be referred to as a first direction, and a direction parallel to the surface of the substrate and perpendicular to the first direction may be referred to as a second direction. Alternatively or additionally, a direction perpendicular to the surface of the substrate may referred to as a vertical direction.

Figure 2:
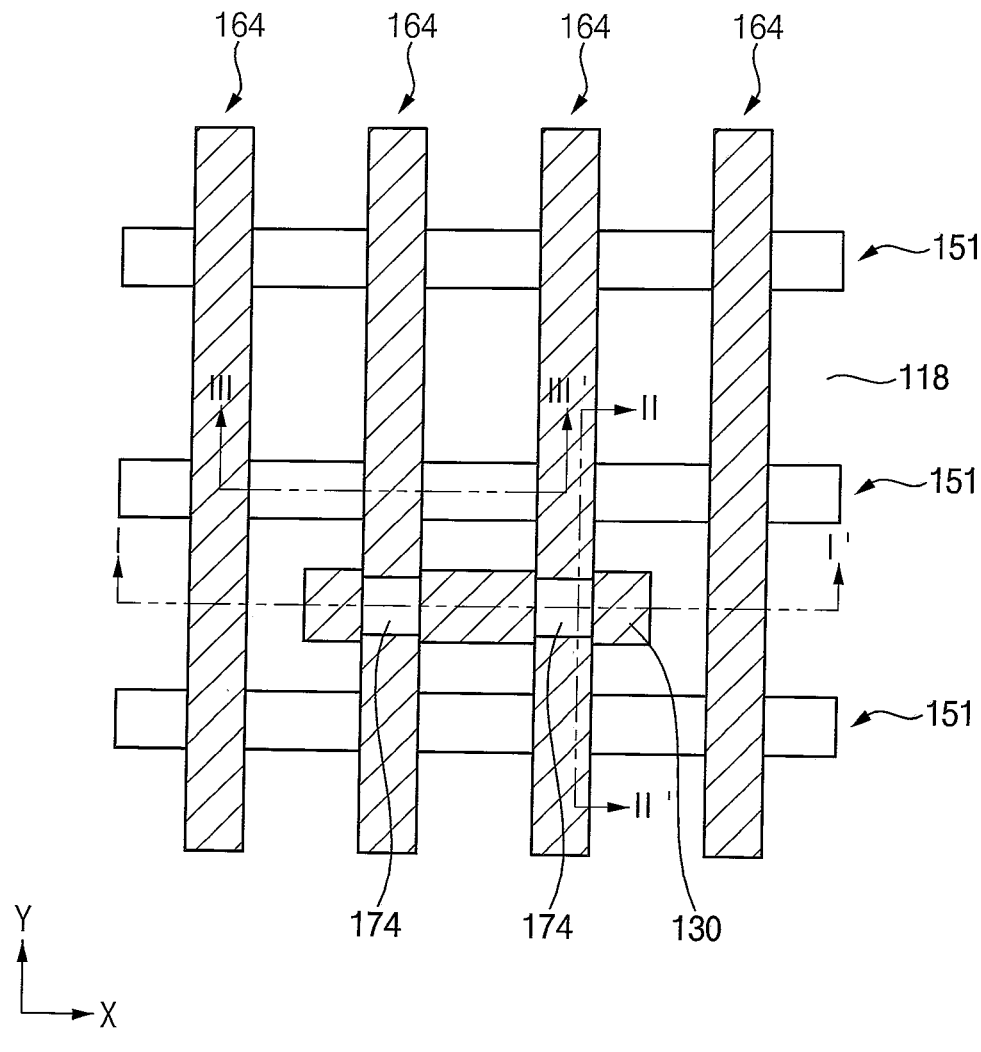

FIGS. 1 and 2 are a cross-sectional view and a plan view illustrating a semiconductor device, in accordance with example embodiments.

FIG. 1 includes cross-sectional views taken along lines I-I', II-II' and III-III' of FIG. 2.

Referring to FIGS. 1 and 2, the semiconductor device may include an active structure 151 protruding from a substrate 100. The active structure 151 may include a lower active pattern 110, a channel structure 116, and an impurity region structure 150. The active structures 151 may extend in the first direction (e.g., direction X). A plurality of active structures 151 may be spaced apart from each other in the second direction (e.g., direction Y).

The substrate 100 may include a group IV semiconductor (e.g., silicon (Si), germanium (Ge), and/or silicon-germanium (SiGe)), a group III-V compound semiconductor, and/or a group II-VI compound semiconductor. In some example embodiments, the substrate 100 may be a silicon-on-insulator (SOI) substrate or a germanium-on-insulator (GOI) substrate.

The lower active pattern 110 may be formed by etching a portion of the substrate 100. Alternatively or additionally, the lower active pattern 110 may extend in the first direction (e.g., direction X). In some embodiments, an isolation pattern 118 may be formed in a trench between a plurality of lower active patterns 110. The isolation pattern 118 may include a silicon oxide (SiO).

The channel structure 116 and the impurity region structure 150 may be formed on the lower active pattern 110.

The channel structure 116 may include first silicon patterns 114b spaced apart from each other in the vertical direction (e.g., direction Z) from an upper surface of the lower active pattern 110. In some embodiments, a gap may be formed between the first silicon patterns 114b in the vertical direction (e.g., direction Z). Each of the first silicon patterns 114b may serve as a channel layer. Alternatively or additionally, the channel structure 116 may serve as a nanosheet.

The impurity region structure 150 may be formed on each of both sides of the channel structure 116 in the second direction (e.g., direction Y). In some embodiments, the impurity region structure 150 may include a semiconductor material. For example, the impurity region structure 150 may include single crystal silicon. For another example, the impurity region structure 150 may include single crystal silicon germanium.

The impurity region structure 150 may be doped with N-type impurities or P-type impurities. The impurity region structure 150 may serve as source/drains of a field effect transistor (FET).

A gate structure 164 may surround the channel structure 116 to cover the channel structure 116. That is, the gate structure 164 may extend in the second direction (e.g., direction Y). In some embodiments, the gate structure 164 may be formed on the channel structure 116 and the isolation pattern 118. The plurality of gate structures 164 may be spaced apart from each other in the first direction (e.g., direction X).

In some region, the gate structures 164 may be spaced apart from each other in the second direction (e.g., direction Y), and may have a cut shape. Thus, each of the gate structures 164 may have end portions in the second direction (e.g., direction Y). A region in which the gate structures 164 are spaced apart in the second direction (e.g., direction Y) may serve as a gate structure cutting regions. The cutting region may be disposed between the end portions of neighboring gate structures in the second direction (e.g., direction Y).

A first insulating interlayer 152 may cover the impurity region structures 150 and both sides in the first direction (e.g., direction X) of the gate structure 164. The first insulating interlayer 152 may include a gate trench 154 extending in the second direction (e.g., direction Y). The gate structure 164 may be formed in the gate trench 154.

The gate structures 164 may include a gate insulation pattern 162a, a gate electrode 162b and a capping pattern 162c.

The gate insulation pattern 162a may be formed along sidewalls and a bottom of the gate trench 154. That is, the gate insulation pattern 162a may be formed on upper surfaces of the lower active pattern 110 and the isolation pattern 118 exposed by a lower surface of the gate trench 154. Alternatively or additionally, the gate insulation pattern 162a may be formed on a surface of the channel structure 116.

The gate insulation pattern 162a may include silicon oxide or a high-k material having a higher dielectric constant than that of silicon oxide. For example, the high-k material may include, but not be limited to, at least one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

An interface insulation layer may be further included at an interface between the gate insulation pattern 162a and the channel structure 116 and an interface between the gate insulation pattern 162a and the lower active pattern 110. In some embodiments, the interfacial insulation layer may include, but not be limited to, silicon oxide (SiO).

The gate electrode 162b may be formed on the gate insulation pattern 162a. The gate electrode 162b may fill a lower portion of the gate trench 154 and the gap. The gate electrode 162b may include a metal. For example, the gate electrode 162b may include, but not be limited to, tungsten (W).

The capping pattern 162c may be formed on the gate electrode 162b, and may fill an upper portion of the gate trench 154. In some embodiments, the capping pattern 162c may include, but not be limited to, at least one of silicon nitride (SiN) and silicon oxynitride (SiON).

An upper surface of the isolation pattern 118 contacting a bottom of the gate structure 164 may be lower than an upper surface of the isolation pattern 118 not contacting the bottom of the gate structure 164. Alternatively or additionally, the bottom of the gate structure 164 contacting the isolation pattern 118 may be lower than an upper surface of the lower active pattern 110.

Hereinafter, a portion of the gate structure 164 contacting the isolation pattern 118 may be referred to as a lower portion of the gate structure 164. Alternatively or additionally, a portion positioned higher than the portion of the gate structure 164 contacting the isolation pattern 118 may be referred to as an upper portion of the gate structure 164. That is, the lower portion of the gate structure 164 may be positioned under an uppermost surface of the isolation pattern 118. In a cutting insulation pattern, a portion contacting the isolation pattern 118 may be referred to as a lower portion of the cutting insulation pattern 174. In the cutting insulation pattern, a portion positioned higher than the isolation pattern 118 may be referred to as an upper portion of the cutting insulation pattern 174. That is, the lower portion of the cutting insulation pattern may be positioned under the uppermost surface of the isolation pattern 118.

The lower portion of the gate structure 164 may have a width in the first direction (e.g., direction X) greater than a width of the upper portion of the gate structure 164. The lower portion of the gate structure 164 may have an expanded width in the first direction (e.g., direction X) when compared to the width of the upper portion of the gate structure 164. The lower portion of the gate structure 164 may expand in a horizontal direction (e.g., the first direction), and may have a laterally convexly rounded shape in a cross-sectional view of the first direction (e.g., direction X). For example, in the cross-sectional view of the first direction (e.g., direction X), the lower portion of the gate structure 164 may have a ball shape.

In some embodiments, the upper portion of the gate structure 164 may have a sidewall slope in which an inner width decreases downward, and/or may have a vertical sidewall slope.

In some embodiments, a spacer 142 may be included between a sidewall of the gate structure 164 and the first insulating interlayer 152. The spacer 142 may include, but not be limited to, silicon nitride (SiN).

A gate structure cutting region including a cutting portion of at least one gate structure 164 may be disposed on the isolation pattern 118. The gate structure cutting region may extend in the first direction (e.g., direction X).

A lower impurity region 130 may be formed at an upper portion of the isolation pattern 118 in the gate structure cutting region. That is, a part of the isolation pattern 118 may serve as the lower impurity region 130.

In example embodiments, an upper surface of the lower impurity region 130 may be coplanar with the upper surface of the isolation pattern 118. In optional or additional embodiments, a bottom of the lower impurity region 130 may be lower than a bottom of the gate structure 164. In other optional or additional embodiments, the bottom of the gate structure 164 positioned on the isolation pattern 118 may be lower than the upper surface of the lower impurity region 130.

The isolation pattern 118 corresponding to the lower impurity region 130 may have a density (e.g., intensity) higher than a density of the isolation pattern 118 undoped with impurities. Alternatively or additionally, the isolation pattern 118 corresponding to the lower impurity region 130 may have an etching resistance (e.g., endurance) higher than an etching resistance of the isolation pattern 118 undoped with impurities. In an etching process, the isolation pattern 118 corresponding to the lower impurity region 130 may have an etching rate lower than an etching rate of the isolation pattern 118 undoped with impurities. In example some embodiments, the impurities doped into the lower impurity region 130 may include, but not be limited to, at least one of silicon (Si), carbon (C), and boron (B).

A fourth opening 170 isolated by the first insulating interlayer 152 and the gate structures 164 may be formed in the gate structure cutting region. The cutting insulation pattern 174 may be formed in the fourth opening 170. In example embodiments, the cutting insulation pattern 174 may include, but not be limited to, at least one of silicon nitride (SiN) and silicon oxynitride (SiON).

The spacer 142 may be formed on sidewalls of the cutting insulation pattern 174 in the first direction (e.g., direction X). Sidewalls of the cutting insulation pattern 174 in the second direction (e.g., direction Y) may contact the end portions of the gate structures 164, respectively.

At least a portion of the lower impurity region 130 may be exposed by a lower portion of the fourth opening 170. Thus, a lower portion of the cutting insulation pattern 174 may contact the lower impurity region 130.

In some embodiments, a bottom of the cutting insulation pattern 174 may have a height different from a height of a bottom of the gate structure 164 positioned on the isolation pattern 118.

In example embodiments, the bottom of the cutting insulation pattern 174 may be lower than the bottom of the gate structure 164 positioned on the isolation pattern 118. In optional or additional embodiments, the bottom of the cutting insulation pattern 174 may be higher than a bottom of the lower impurity region 130.

In a cross-sectional view in the first direction (e.g., direction X), the lower portion of the cutting insulation pattern 174 may have a shape different from a shape of the lower portion of the gate structure 164 positioned on the isolation pattern 118. That is, the lower portion of the cutting insulation pattern 174 may have a shape different from a shape of the lower portion of the gate structure 164 contacting the isolation pattern 118.

The lower portion of the cutting insulation pattern 174 may not expanded in the first direction (e.g., direction X). In example embodiments, the lower portion of the cutting insulation pattern 174 may have a sidewall slope in which an inner width may gradually decrease downward. In optional or additional embodiments, the lower portion of the cutting insulation pattern 174 may have a vertical sidewall slope.

In example embodiments, in the cross-sectional view of the first direction (e.g., direction X), the lower portion of the gate structure 164 may have a laterally convexly rounded shape.

In optional or additional embodiments, a plurality of cutting insulation patterns 174 may be disposed on the lower impurity region 130. For example, at least two cutting insulation patterns 174 may be disposed on the lower impurity region 130 to be spaced apart from each other in the first direction (e.g., direction X). Alternatively or additionally, one cutting insulation pattern 174 may be disposed on the lower impurity region 130.

As the lower portion of the cutting insulation pattern 174 may not be expanded in the first direction (e.g., direction X), conductive materials included in the gate structure 164 may not remain in the fourth opening 170 for forming the cutting insulation pattern 174. Thus, a bridge defect between the gate structures 164 caused by the remaining conductive materials in the fourth opening 170 may be decreased.

Figure 3:
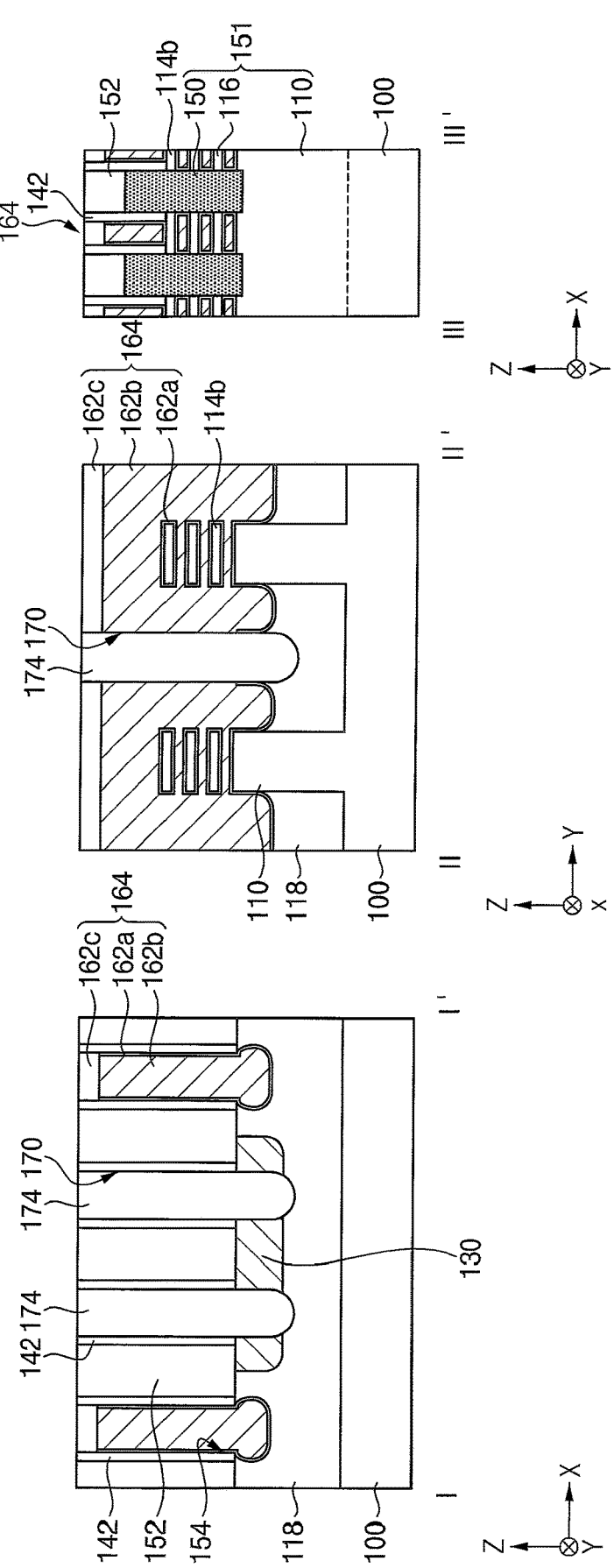
FIG. 3 is a cross-sectional view of a semiconductor device, in accordance with example embodiments.
Figure 4:
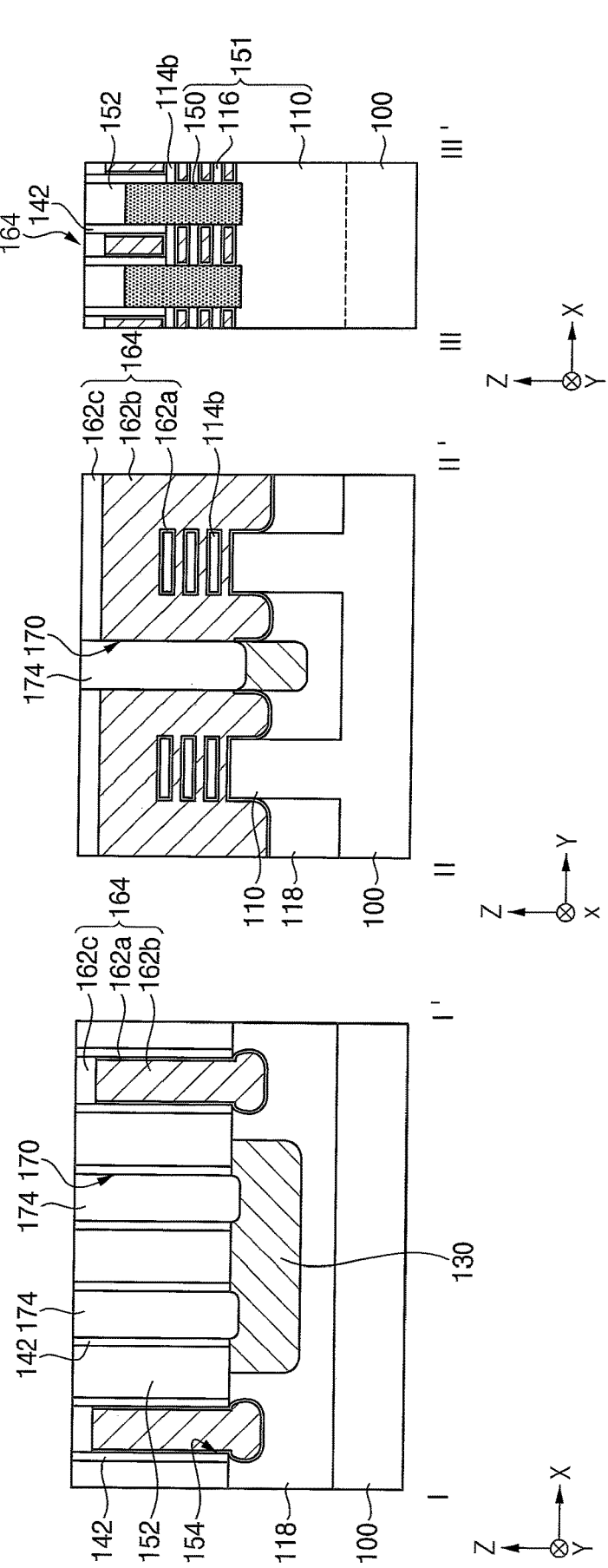
FIG. 4 is a cross-sectional view of a semiconductor device, in accordance with example embodiments.

FIG. 3 is a cross-sectional view of a semiconductor device, in accordance with example embodiments. FIG. 4 is a cross-sectional view of a semiconductor device, in accordance with example embodiments.

Each of the semiconductor devices shown in FIGS. 3 and 4 may be substantially the same as and/or include the semiconductor devices shown in FIGS. 1 and 2, and may include additional features not mentioned above. For example, the semiconductor devices shown in FIGS. 3 and 4 may differ from the semiconductor devices shown in FIGS. 1 and 2 in the cutting insulation pattern and the lower impurity region.

Referring to FIG. 3, a bottom of the cutting insulation pattern 174 may be lower than a bottom of the gate structure 164 positioned on the isolation pattern 118. Alternatively or additionally, the bottom of the cutting insulation pattern 174 may be lower than a bottom of the lower impurity region 130. Thus, a lower sidewall of the cutting insulation pattern 174 may contact the lower impurity region 130. In some embodiments, the bottom of the cutting insulation pattern 174 may not contact the lower impurity region 130.

In optional or additional embodiments, the bottom of the lower impurity region 130 may be lower than the bottom of the gate structure 164 positioned on the isolation pattern 118.

Referring to FIG. 4, a bottom of the cutting insulation pattern 174 may be higher than a bottom of the gate structure 164 positioned on the isolation pattern 118. Alternatively or additionally, the bottom of the cutting insulation pattern 174 may be higher than a bottom of the lower impurity region 130. In some embodiments, the bottom of the cutting insulation pattern 174 may contact an upper surface of the lower impurity region 130.

In optional or additional embodiments, the bottom of the lower impurity region 130 may be lower than the bottom of the gate structure 164 positioned on the isolation pattern 118.

As such, the bottom of the cutting insulation pattern 174 may have a height different from a height of the bottom of the gate structure 164 positioned on the isolation pattern 118.

FIGS. 5 to 19 are cross-sectional views and plan views illustrating a method of manufacturing a semiconductor device, in accordance with example embodiments.

FIGS. 5, 7, 9, 11, 12, 14 to 19 are cross-sectional views, and FIGS. 6, 8, 10 and 13 are plan views. Each of the cross-sectional views includes cross-sectional views taken along lines I-I', II-II' and III-III' of FIG. 2.

Figure 5:
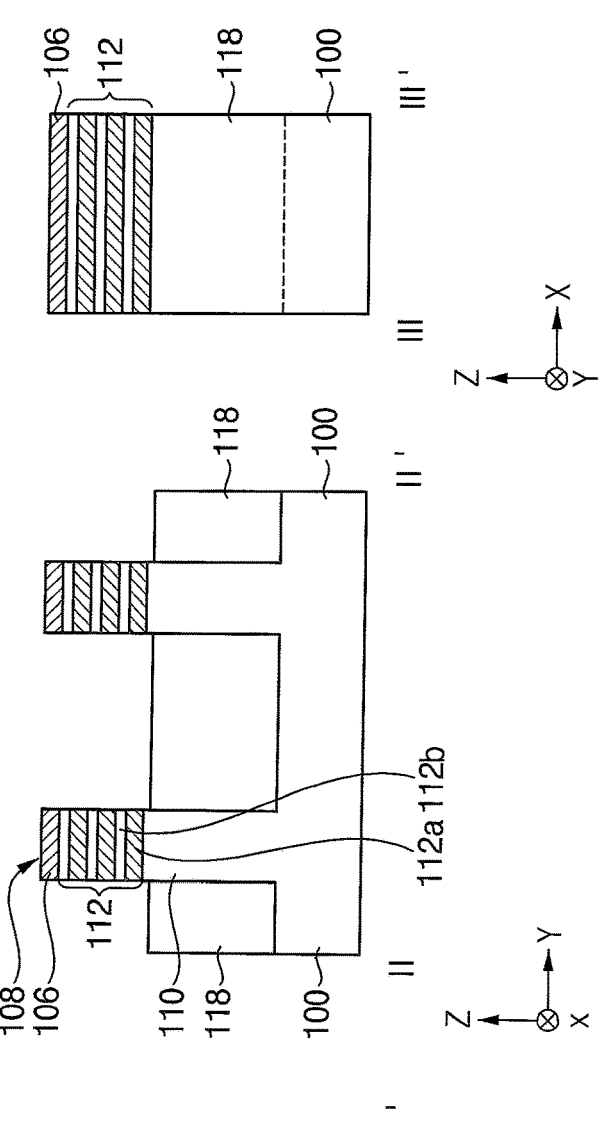
Figure 5:
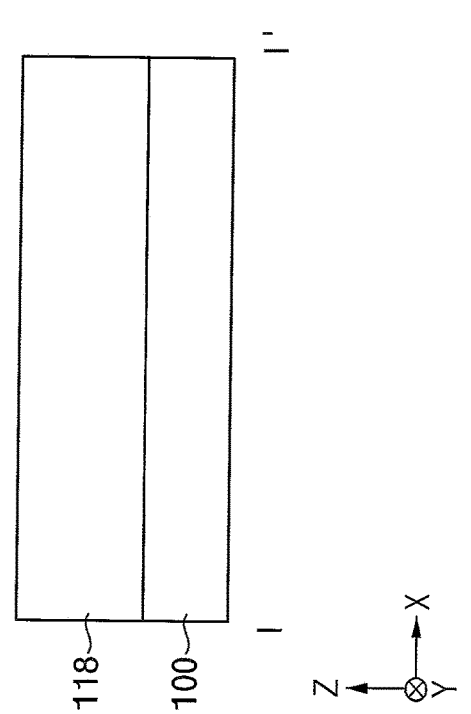
Figure 6:
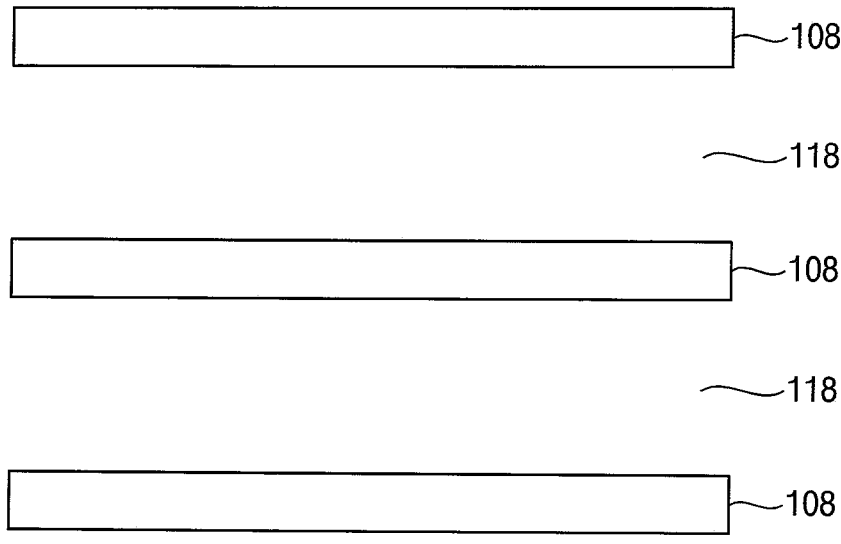
Figure 6:
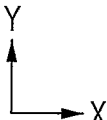

Referring to FIGS. 5 and 6, two semiconductor layers having a high etching selectivity may be alternately and repeatedly formed on a substrate 100. For example, a silicon germanium layer and a silicon layer may be alternately and repeatedly formed on the substrate 100. A mask pattern 106 may be formed on an uppermost silicon layer. Alternatively or additionally, the substrate 100 may include a single crystal silicon substrate.

The silicon germanium layer and the silicon layer may be formed by a selective epitaxial growth process using an upper portion of the substrate 100 as a seed.

In example embodiments, the silicon layer may be formed by a selective epitaxial growth process using, for example, a silicon source gas such as, but not limited to, disilane ($Si_2H_6$) gas. In other optional or additional embodiments, the silicon layer may include, but not be limited to, single crystal silicon.

In example embodiments, the silicon germanium layer may be formed by a selective epitaxial growth process using, for example, at least one of a silicon source gas such as, but not limited to, dichlorosilane ($SiH_2Cl_2$) gas, and a germanium source gas such as, but not limited to, germanium tetrahydride ($GeH_4$) gas. In other optional or additional embodiments, the silicon germanium layer may include, but not be limited to, single crystal silicon germanium.

The silicon layer, the silicon germanium layer, and an upper portion of the substrate 100 may be etched using the mask pattern 106 as an etching mask to form preliminary active structures 108. A first trench may be formed between the preliminary active structures 108. The etching process may include, but not be limited to, an anisotropic etching process.

The preliminary active structures 108 may extend in the first direction (e.g., direction X). Alternatively or additionally, the preliminary active structures 108 may be spaced apart from each other at the same distance in the second direction (e.g., direction Y).

In example embodiments, the preliminary active structures 108 may include a lower active pattern 110 and a first fin structure 112 stacked in the vertical direction (e.g., direction Z). The lower active pattern 110 may be formed by etching the upper portion of the substrate 100. The first fin structure 112 may include silicon germanium patterns 112*a* and silicon patterns 112*b* that are alternately and repeatedly stacked.

In some embodiments, an isolation layer may be formed to fill the first trench. An upper portion of the isolation layer may be etched to form an isolation pattern 118 filling a lower portion of the first trench. The isolation pattern 118 may cover sidewalls of the lower active pattern 110. The first fin structure 112 may protrude upward from a portion between the isolation patterns 118. The isolation pattern 118 may include, but not limited to, silicon oxide (SiO).

Figure 8:
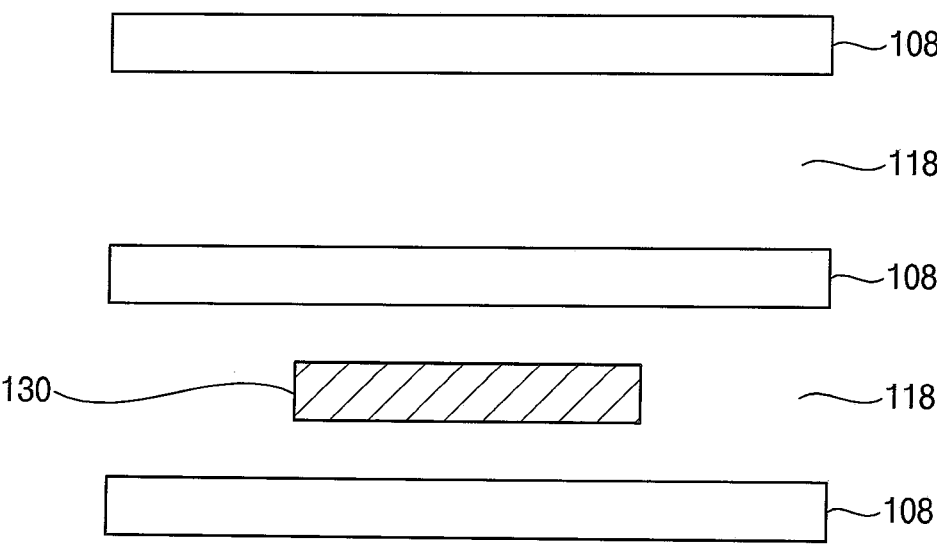
Figure 8:
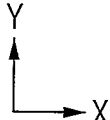

Referring to FIGS. 7 and 8, an ion implantation mask pattern 120 may be formed on the isolation pattern 118, the first fin structure 112 and the mask pattern 106. The ion implantation mask pattern 120 may include a photoresist pattern.

The ion implantation mask pattern 120 may include a first opening 122. The first opening 122 may be positioned at a region corresponding to a gate structure cutting region. One or a plurality of cutting portions of the gate structures may be positioned in the gate structure cutting region.

In some embodiments, an exposure mask used in a photo process for forming the ion implantation mask pattern 120 may be substantially the same as an exposure mask used for forming the cutting portions of the gate structure. The first opening 122 may be positioned on the isolation pattern 118.

Impurities may be doped into an upper portion of the isolation pattern 118 exposed by the first opening 122 of the ion implantation mask pattern 120 to form a lower impurity region 130. The lower impurity region 130 may serve as an etch stop region in subsequent processes. As the impurities may be out diffused from the exposed isolation pattern 118, the lower impurity region 130 may be formed to have a width slightly greater than a width the first opening 122. Alternatively or additionally, a density and an etching resistance of the isolation pattern 118 may be increased by the doping of the impurities.

In some embodiments, the isolation pattern 118 corresponding to the lower impurity region 130 may have a density higher than that of the isolation pattern 118 undoped with impurities. Alternatively or additionally, the isolation pattern 118 corresponding to the lower impurity region 130 may have an etching resistance higher than that of the isolation pattern 118 undoped with impurities. Thus, when an etching process is performed, the isolation pattern 118 corresponding to the lower impurity region 130 may have an etching rate lower than that of the isolation pattern 118 undoped with impurities.

In example embodiments, the impurities doped into the lower impurity region 130 may include, but not be limited to, at least one of silicon (Si), carbon (C), and boron (B).

The lower impurity region 130 may be formed at a region between the preliminary active structures 108. The lower impurity region 130 may extend in the first direction (e.g., direction X). In example embodiments, a plurality of cutting portions of the gate structure subsequently formed may be disposed on the lower impurity region 130. In some example embodiments, one cutting portion of the gate structure subsequently formed may be disposed on the lower impurity region 130.

Figure 9:
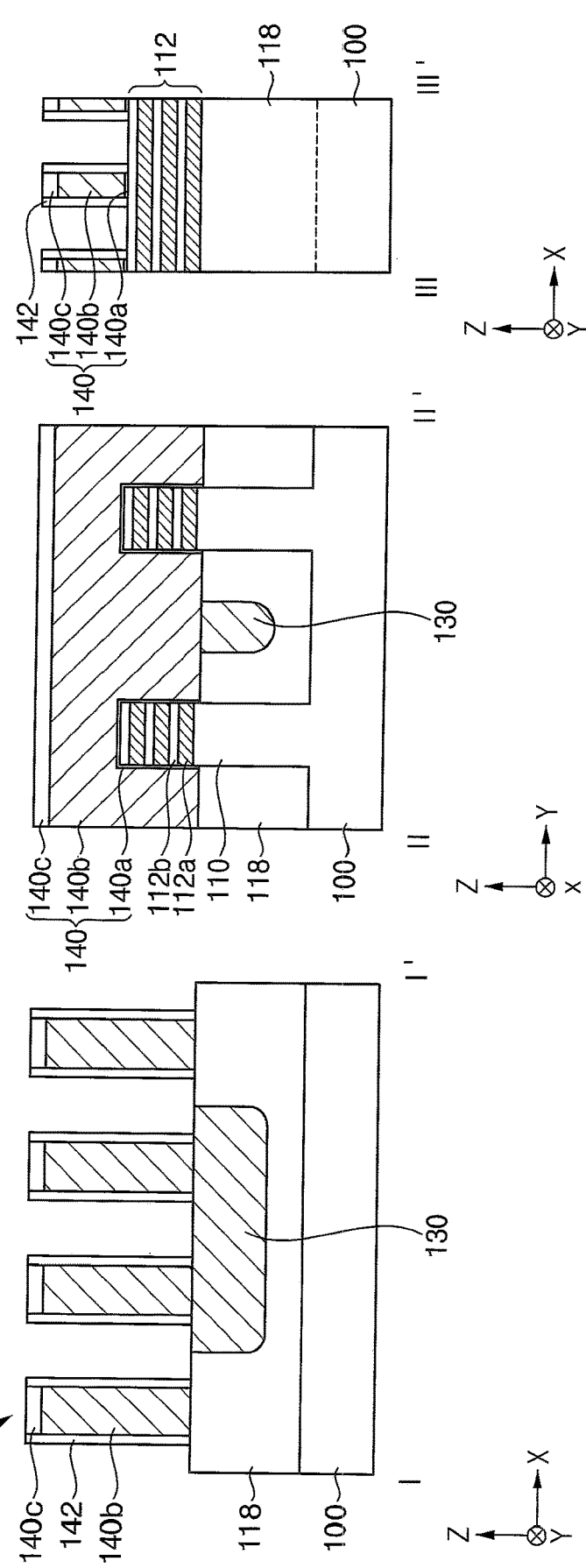
Figure 10:
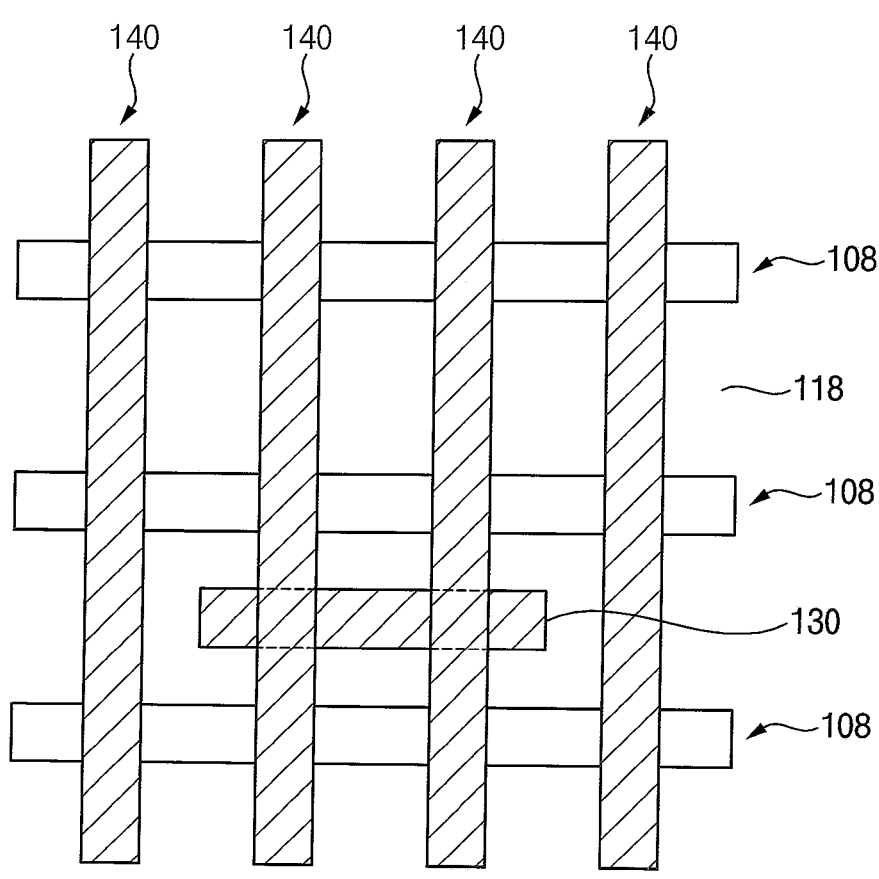
Figure 10:
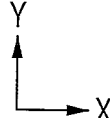

Referring to FIGS. 9 and 10, the ion implantation mask pattern 120 may be removed. Alternatively or additionally, the mask pattern 106 may be removed.

Dummy gate structures 140 may be formed on the isolation pattern 118 and the first fin structure 112 to partially cover the isolation pattern 118 and the first fin structure 112. In some embodiments, the dummy gate structures 140 may extend in the second direction (e.g., direction Y). That is, the dummy gate structures 140 may cross the first fin structure 112.

The dummy gate structures 140 may be spaced apart from each other in the first direction (e.g., direction X). In example embodiments, the dummy gate structures 140 may be spaced apart from each other at the same distance in the first direction (e.g., direction X). In other optional or additional embodiments, the distance in the first direction (e.g., direction X) between each of the dummy gate structures 140 may vary. That is, the dummy gate structures 140 may be spaced apart from each other at different distances in the first direction (e.g., direction X).

The dummy gate structure 140 may include a dummy gate insulation pattern 140*a*, a dummy gate electrode 140*b* and a dummy gate mask pattern 140*c*. The dummy gate insulation pattern 140*a* may include, but not be limited to, silicon oxide (SiO). The dummy gate electrode 140*b* may include, but not be limited to, a polysilicon. Alternatively or additionally, the dummy gate mask pattern 140*c* may include, but not be limited to, at least one of silicon nitride (SiN) and silicon oxynitride (SiON).

The dummy gate structure 140 may be formed on a portion for forming a gate structure and the cutting portion of the gate structure in a multi-bridge channel transistor may be subsequently formed.

A spacer 142 may be formed on sidewalls of the dummy gate structure 140. The spacer 142 may include, but not be limited to, at least one of silicon nitride (SiN) and silicon oxynitride (SiON).

Figure 11:
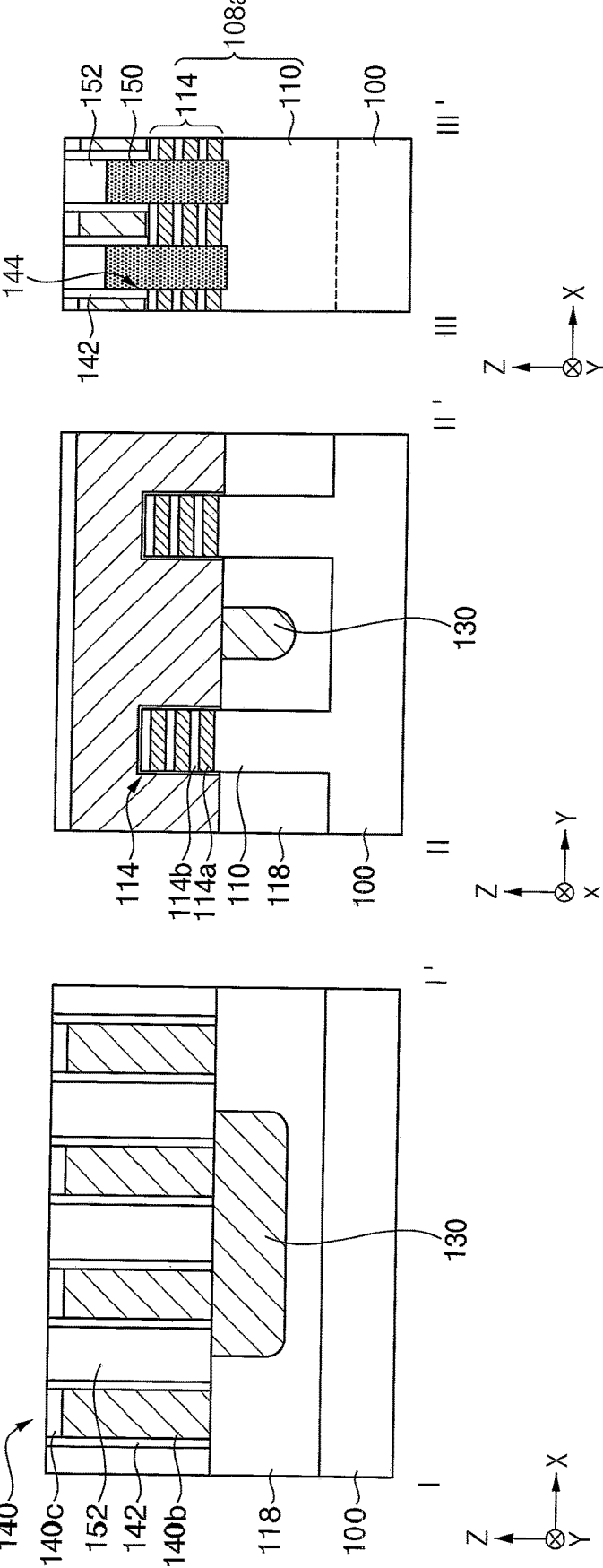

Referring to FIG. 11, the first fin structure 112 positioned between the dummy gate structures 140 may be removed to form second openings 144. Accordingly, the first fin structure 112 may be cut to form respective preliminary channel structures 114. The preliminary channel structures 114 may include a first silicon germanium pattern 114*a* and a first silicon pattern 114*b* that may be alternately and repeatedly stacked.

In some embodiments, the lower active pattern 110 may be exposed on a bottom of the second opening 144 between the preliminary channel structures 114.

In example embodiments, after forming the second openings 144, a sidewall of an exposed first silicon germanium pattern 114*a* may be partially etched to form a recess, and an inner spacer may be further formed in the recess.

A selective epitaxial growth process may be performed to form the impurity region structure 150 in the second openings 144. The impurity region structure 150 may include, but not be limited to, a semiconductor material.

In example embodiments, the impurity region structure 150 may include, but not be limited to, single crystal silicon. In other optional or additional embodiments, the impurity region structure 150 may include, but not be limited to, single crystal silicon germanium.

In example embodiments, when the selective epitaxial growth process is performed, N-type or P-type impurities may be doped in situ. Thus, the impurity region structure 150 may be doped with impurities, and may serve as source/drain regions of the multi-bridge channel field effect transistor (MBCFET) that may be subsequently formed.

In the selective epitaxial growth process, crystal growth may be performed in the vertical direction (e.g., direction Z) from the lower active pattern 110 on the bottom of the second opening 144. Alternatively or additionally, in the selective epitaxial growth process, crystal growth may be performed in the second direction (e.g., direction Y). Thus, each of the impurity region structures 150 may have a polygonal shape in which a central portion protrudes (not shown), in a cross-section of the second direction (e.g., direction Y).

A first insulating interlayer 152 may be formed to cover the impurity region structure 150, the isolation pattern 118 and the dummy gate structures 140. Thereafter, the first insulating interlayer 152 may be planarized until an upper surface of the dummy gate structure 140 may be exposed.

Figure 12:
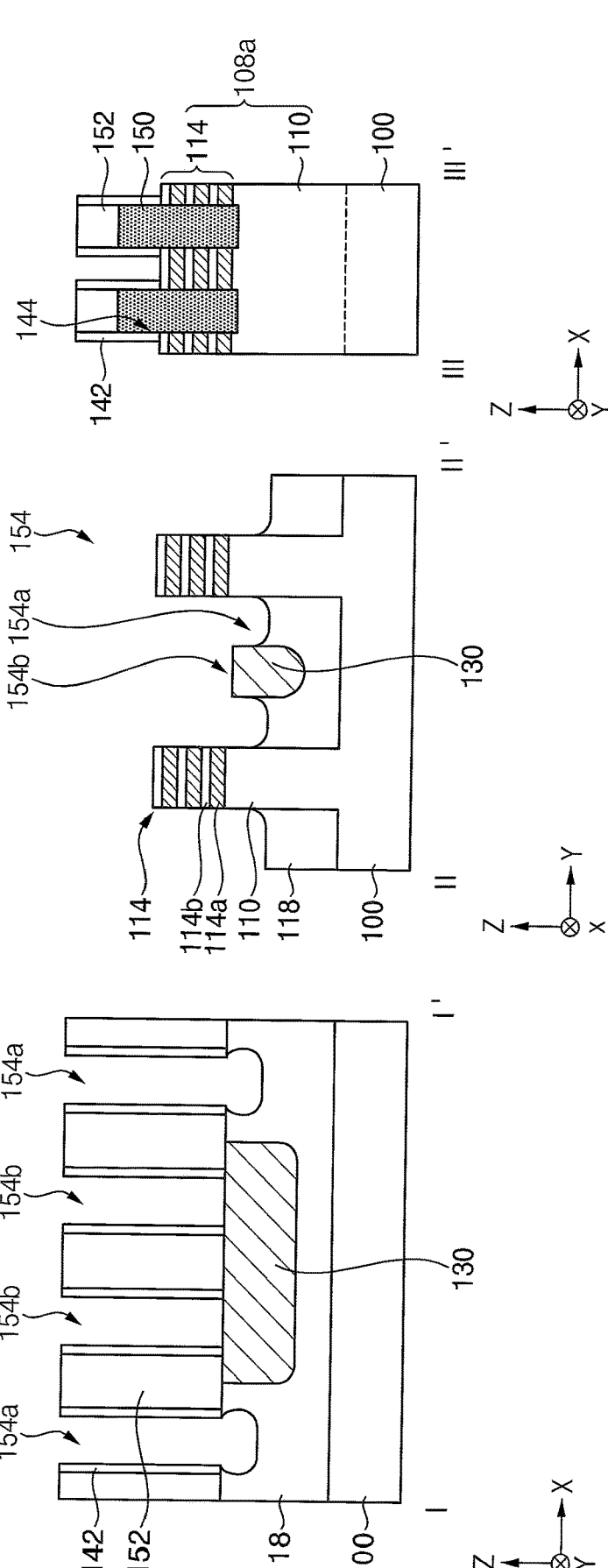
Figure 13:
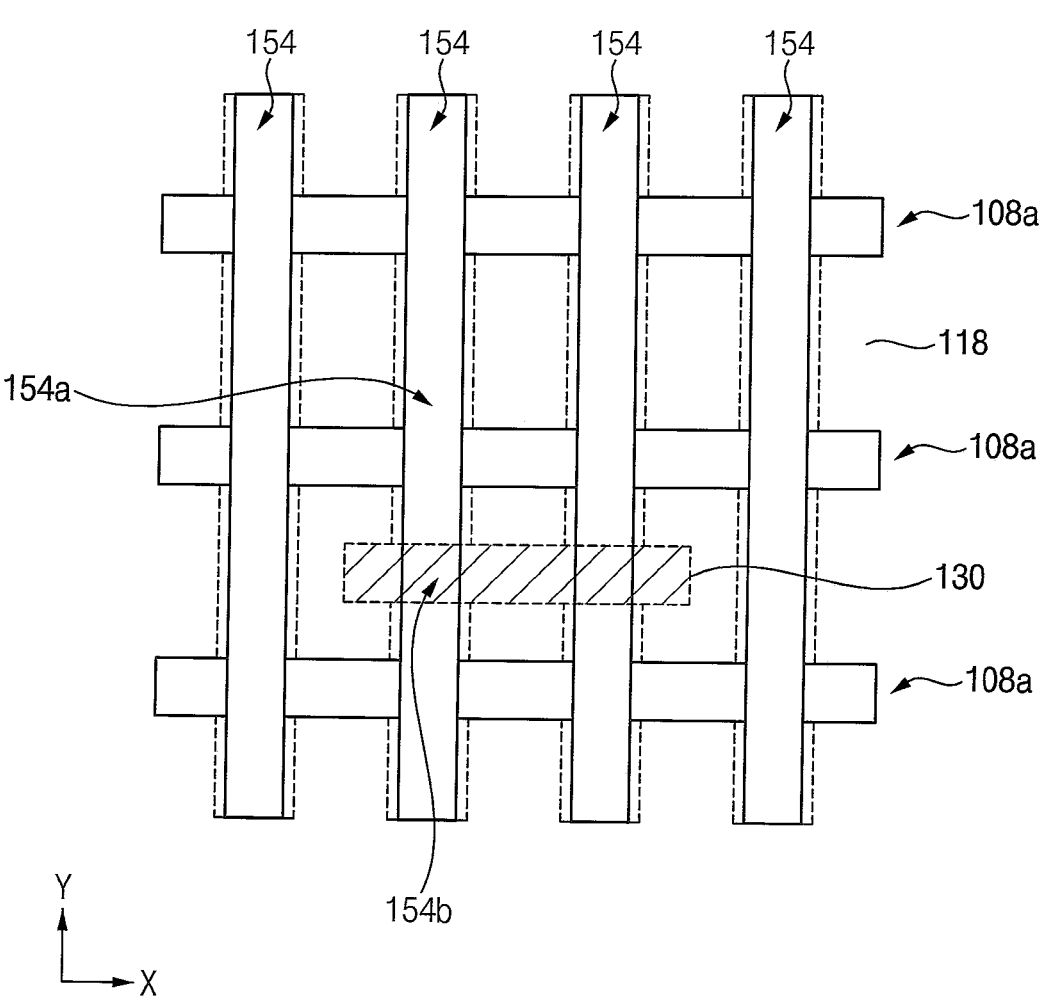

Referring to FIGS. 12 and 13, the dummy gate structure 140 may be removed to form a gate trench 154. The first silicon germanium pattern 114a and the first silicon pattern 114b included in the preliminary channel structures 114 may be exposed by the gate trench 154.

An upper surface of the isolation pattern 118 may be exposed on a bottom of the gate trench 154. In an etching process for forming the gate trench 154, at least an upper portion of the isolation pattern 118 may be removed. In some embodiments, a height of the bottom of the gate trench 154 may be different depending on a position of the gate trench 154.

For example, the dummy gate mask pattern 140c and the dummy gate electrode 140b may be sequentially removed. Thereafter, the dummy gate insulation pattern 140a may be removed. The process of removing the dummy gate structure 140 may include, but not be limited to, an isotropic etching process.

The dummy gate insulation pattern 140a and the isolation pattern 118 may be formed of and/or include, but not be limited to, silicon oxide. That is, in the process of removing the dummy gate insulation pattern 140a, the isolation pattern 118 under the dummy gate insulation pattern 140a may also be removed. Since the dummy gate insulation pattern 140a may be removed by the isotropic etching process, the isolation pattern 118 may be etched in the vertical direction (e.g., direction Z) and the horizontal direction from the bottom of the dummy gate structure 140. A lower portion of the gate trench 154 may expand in the vertical direction (e.g., direction Z) and the horizontal direction by the etching process, so that the lower portion of the gate trench 154 may have a convexly rounded shape.

Alternatively or additionally, the isolation pattern 118 corresponding to the lower impurity region 130 may have an intensity (e.g., density) higher than that of the isolation pattern 118 in other regions and may have an etching rate lower than that of the isolation pattern 118 in other regions. Thus, the lower impurity region 130 may be hardly (e.g., not substantially) etched during the etching process of the dummy gate insulation pattern 140a. A lower portion of the gate trench 154 opposite to the lower impurity region 130 may hardly (e.g., not substantially) expand in the horizontal direction and the vertical direction (e.g., direction Z).

The gate trench 154 may include a first portion 154a not facing the lower impurity region 130 and a second portion 154b facing the lower impurity region 130.

A lower portion of the second portion 154b of the gate trench may not expand in the horizontal direction.

A lower portion of the first portion 154a of the gate trench may have a shape different from that of the lower portion of the second portion 154b of the gate trench. The lower portion of the first portion 154a of the gate trench may have a sidewall profile different from that of the lower portion of the second portion 154b of the gate trench. The lower portion of the first portion 154a of the gate trench may have an inner width expanding in the horizontal direction. The lower portion of the first portion 154a of the gate trench may expand in the vertical direction (e.g., direction Z) and the horizontal direction, so that the lower portion of the first portion 154a of the gate trench may have a convexly rounded shape.

In example embodiments, a bottom of the second portion 154b of the gate trench may be higher than a bottom of the first portion 154a of the gate trench. In other optional or additional embodiments, the bottom of the second portion 154b of the gate trench may protrude in the vertical direction (e.g., direction Z) from the bottom of the first portion 154a of the gate trench.

Referring to FIG. 14, the first silicon germanium pattern 114a exposed by the gate trench 154 may be selectively removed to form gaps 156 between the first silicon patterns 114b. The first silicon patterns 114b being spaced apart from each other in the vertical direction (e.g., direction Z) may serve as a channel region of the multi-bridge channel field-effect transistor (MBCFET). Alternatively or additionally, the first silicon patterns 114b may serve as a nanosheet.

As the first silicon germanium pattern 114a may be removed, the preliminary channel structures 114 may be formed as a channel structure.

The removing process of the first silicon germanium pattern 114a may include, but not be limited to, an isotropic etching process. In the isotropic etching process, the isolation pattern 118 under the first portion 154a of the gate trench may be further etched. In some embodiments, the isolation pattern 118 under the second portion 154b of the gate trench 154 may have relatively high etching selectivity, so that the isolation pattern 118 under the second portion 154b of the gate trench 154 may be hardly (e.g., not substantially) etched in the isotropic etching process.

Figure 15:
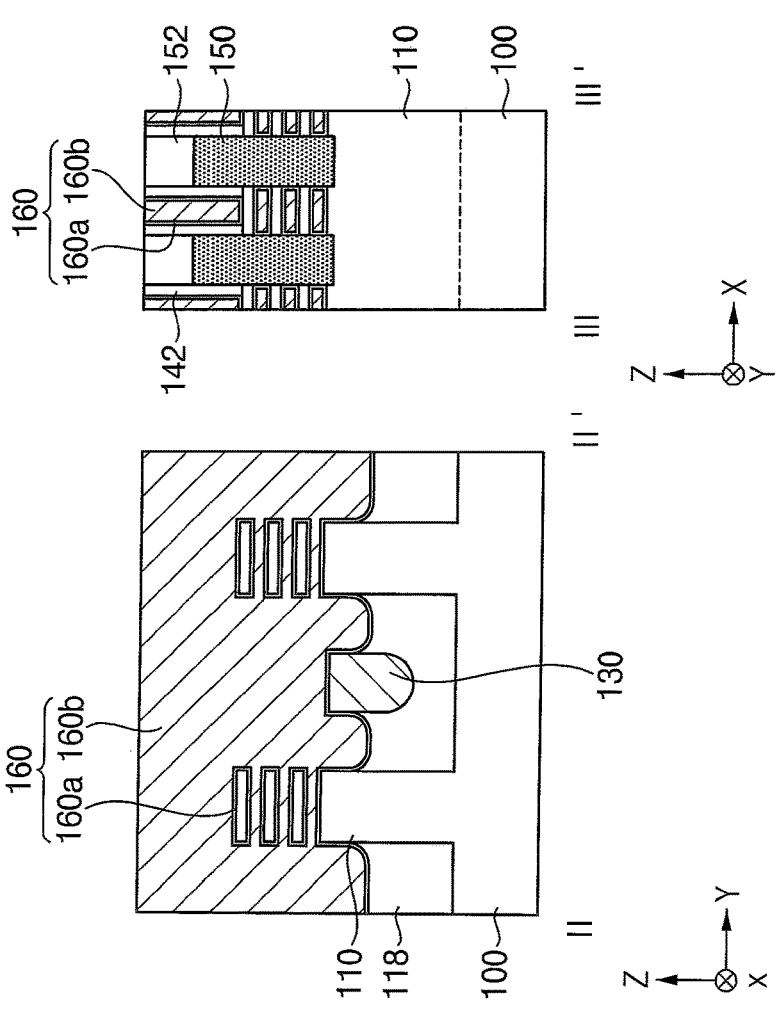
Figure 15:
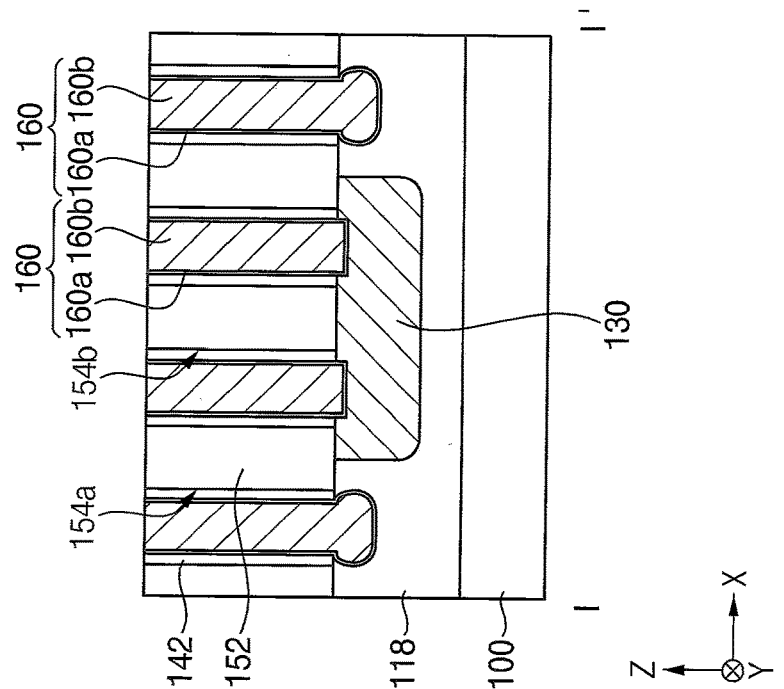
Figure 16:
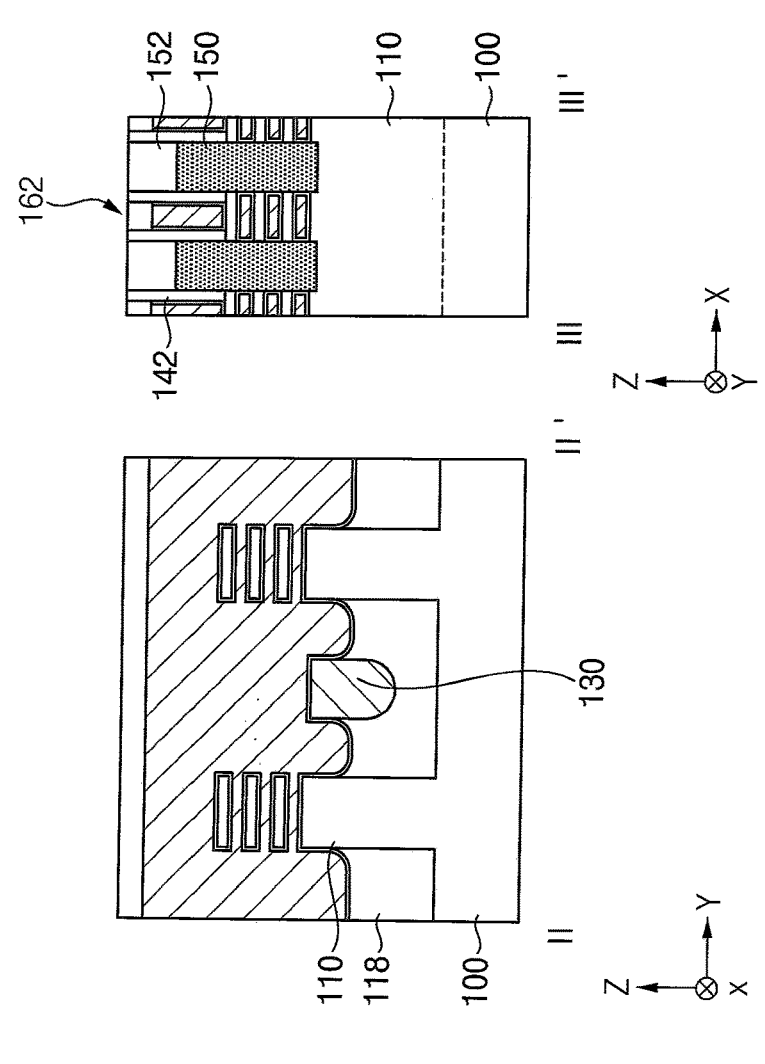
Figure 16:
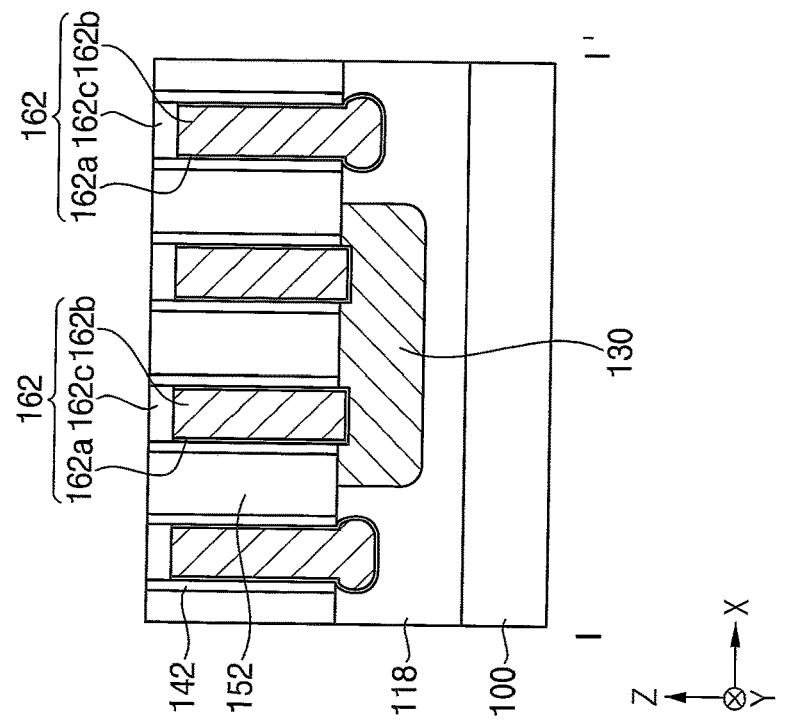

Referring to FIG. 15, a first preliminary gate structure 160 may be formed to fill the gate trench 154 and the gaps 156. The first preliminary gate structure 160 may include a preliminary gate insulation pattern 160a and a preliminary gate electrode 160b.

For example, a gate insulation layer may be formed along a profile of an upper surface of the lower active pattern 110, the first silicon patterns 114b, and the isolation pattern 118 exposed by the gate trench 154 and the gaps 156. Alternatively or additionally, a gate electrode layer may be formed on the gate insulation layer to fill the gate trench 154 and the gaps 156. The gate electrode layer may include, but not be limited to, a metal material. Thereafter, the gate electrode layer and the gate insulation layer may be planarized until an upper surface of the first insulating interlayer 152 may be exposed to form the preliminary gate insulation pattern 160a and the preliminary gate electrode 160b.

In example embodiments, the preliminary gate insulation pattern 160a may include, but not be limited to, at least one of a silicon oxide (SiO) and a high-k layer having a dielectric constant higher than that of silicon oxide. The preliminary gate electrode 160b may include, but not be limited to, a metal. For example, the preliminary gate electrode 160b may include, but not be limited to, tungsten (W).

As shown in FIG. 15, a lower portion of the first preliminary gate structure 160 positioned in the first portion 154a of the gate trench may have an inner width expanding in the horizontal direction. The lower portion of the first preliminary gate structure 160 positioned in the first portion 154a of the gate trench may expand in the vertical direction (e.g., direction Z) and the horizontal direction, so that the lower portion of the first preliminary gate structure 160 positioned in the first portion 154a of the gate trench may have a convexly rounded shape.

The lower portion of the first preliminary gate structure 160 positioned in the second portion 154b of the gate trench may have a shape different from a shape of the lower portion of the first preliminary gate structure 160 positioned in the first portion 154a of the gate trench. The lower portion of the first preliminary gate structure 160 positioned in the second portion 154b of the gate trench may not expand in the horizontal direction Referring to FIG. 16, upper portions of the preliminary gate insulation pattern 160a and the preliminary gate electrode 160b may be removed to form a recess. A capping pattern 162c may be formed in the recess. Thus, the second preliminary gate structure 162 including the gate insulation pattern 162a, the gate electrode 162b, and the capping pattern 162c may be formed.

The second preliminary gate structure 162 may be formed to fill the gate trench 154 and the gap 156. The second preliminary gate structure 162 may extend in the second direction (e.g., direction Y).

Referring to FIG. 17, an etch mask pattern 166 may be formed on the second preliminary gate structure 162 and the first insulating interlayer 152. The etch mask pattern 166 may include, but not be limited to, a photoresist pattern.

The etch mask pattern 166 may include a third opening 168. The third opening 168 may be positioned at the position of the first opening 122 of the ion implantation mask pattern 120. The third opening 168 may be disposed at the gate structure cutting region. Accordingly, an exposure mask used in a photo process for forming the etch mask pattern 166 may be substantially the same as an exposure mask used in a photo process for forming the ion implantation mask pattern 120.

The second preliminary gate structures 162 may be selectively etched using the etch mask pattern 166 to form gate structures 164. In the etching process, the second preliminary gate structure 162 positioned in the second portion 154b of the gate trench 154 may be etched to form gate structures 164 spaced apart from each other in the second direction (e.g., direction Y). The gate structure 164 may be formed in the first portion 154a of the gate trench. A fourth opening 170 may be formed between the gate structures 164 in the second direction (e.g., direction Y). The etching process may include an anisotropic etching process.

The lower portion of the second preliminary gate structure 162 in the second portion 154b of the gate trench may not have an expanded shape, so that the second preliminary gate structure 162 may not remain in the fourth opening 170 after the etching process of the second preliminary gate structure 162. Accordingly, the second preliminary gate structure 162 may be completely cut to form the gate structures 164. A stringer defect (e.g., a bridge defect), in which the gate structures 164 are connected to each other by remaining second preliminary gate structure 162 in the fourth opening 170, may not occur.

If the lower portion of the second preliminary gate structure in the second portion 154b of the gate trench is expanded, then the second preliminary gate structure formed in the extended portion may remain in the fourth opening after the etching process of the second preliminary gate structure. If the second preliminary gate structure remains in the fourth opening, then the second preliminary gate structure may not be completely cut. Therefore, conductive materials of the preliminary gate structure may remain between the gate structures, and thus a defect, in which gate structures are electrically connected to each other, may occur.

A lower portion of the fourth opening 170 formed by the etching process may not have an expanded shape. In example embodiments, the lower portion of the fourth opening 170 may have a sidewall slope in which an inner width decreases downward. In other optional or additional embodiments, the fourth opening 170 may have a vertical sidewall slope.

In example embodiments, the second preliminary gate structure 162 may be etched and the lower impurity region thereunder may be over etched, in order to completely cut the second preliminary gate structure 162. In the etching process, at least a portion of the lower impurity region 130 may be removed. A bottom of the fourth opening 170 may be lower than a bottom of the second preliminary gate structure 162 positioned in the first portion 154a of the gate trench.

In example embodiments, a bottom of the fourth opening 170 may be higher than a bottom of the lower impurity region 130. In this case, the semiconductor device shown in FIG. 1 may be manufactured by subsequent processes.

In other optional or additional embodiments, a bottom of the fourth opening 170 may be lower than a bottom of the lower impurity region 130. In such embodiments, the semiconductor device shown in FIG. 3 may be manufactured by subsequent processes.

Figure 18:
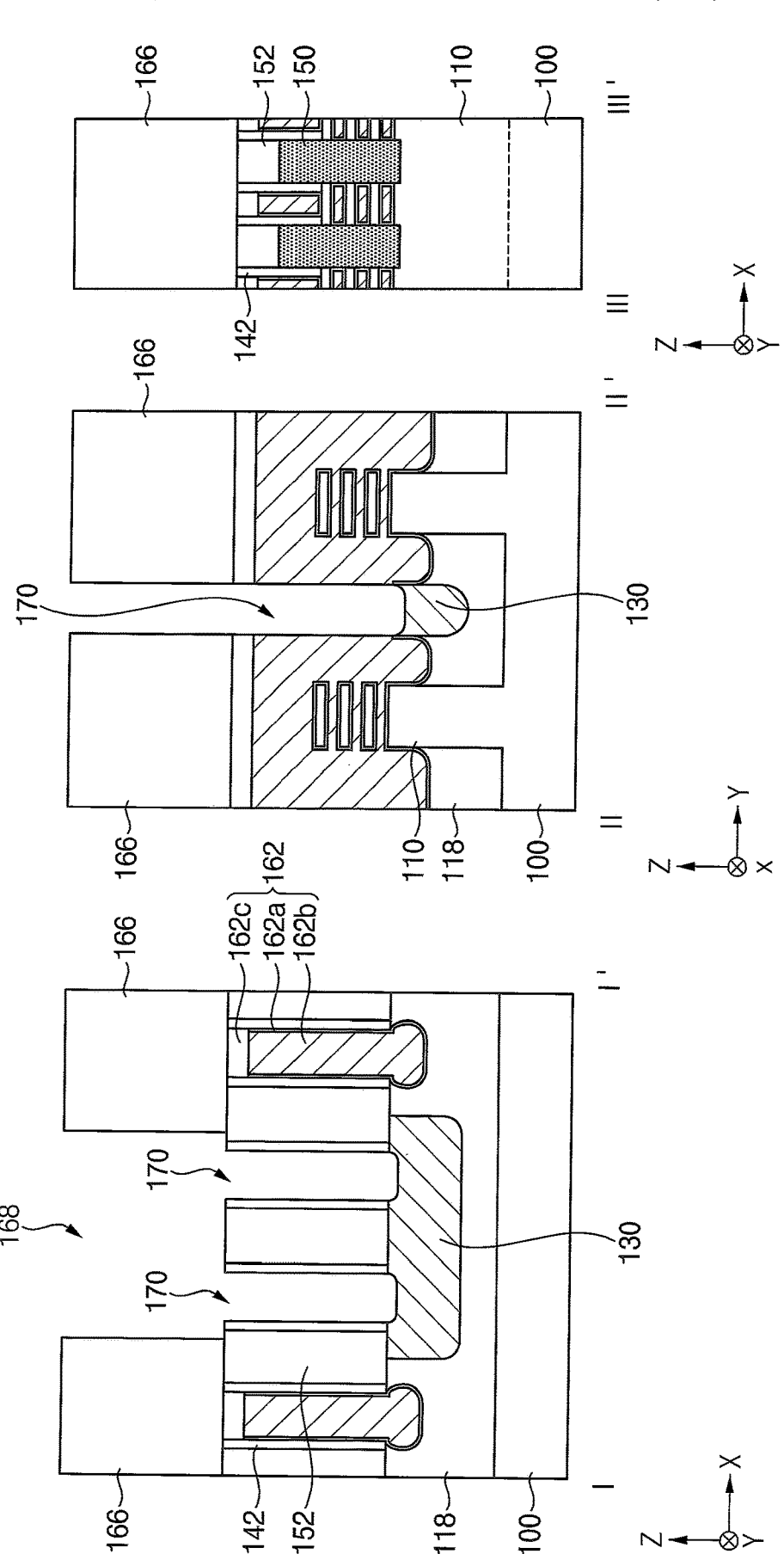

In some example embodiments, as illustrated in FIG. 18, the second preliminary gate structure 162 may be etched, and the lower impurity region thereunder may be hardly (e.g., not substantially) etched. In such embodiments, the bottom of the fourth opening 170 may be higher than the bottom of the second preliminary gate structure 162 positioned in the first portion 154a of the gate trench. As such, the semiconductor device shown in FIG. 4 may be manufactured by subsequent processes.

Figure 19:
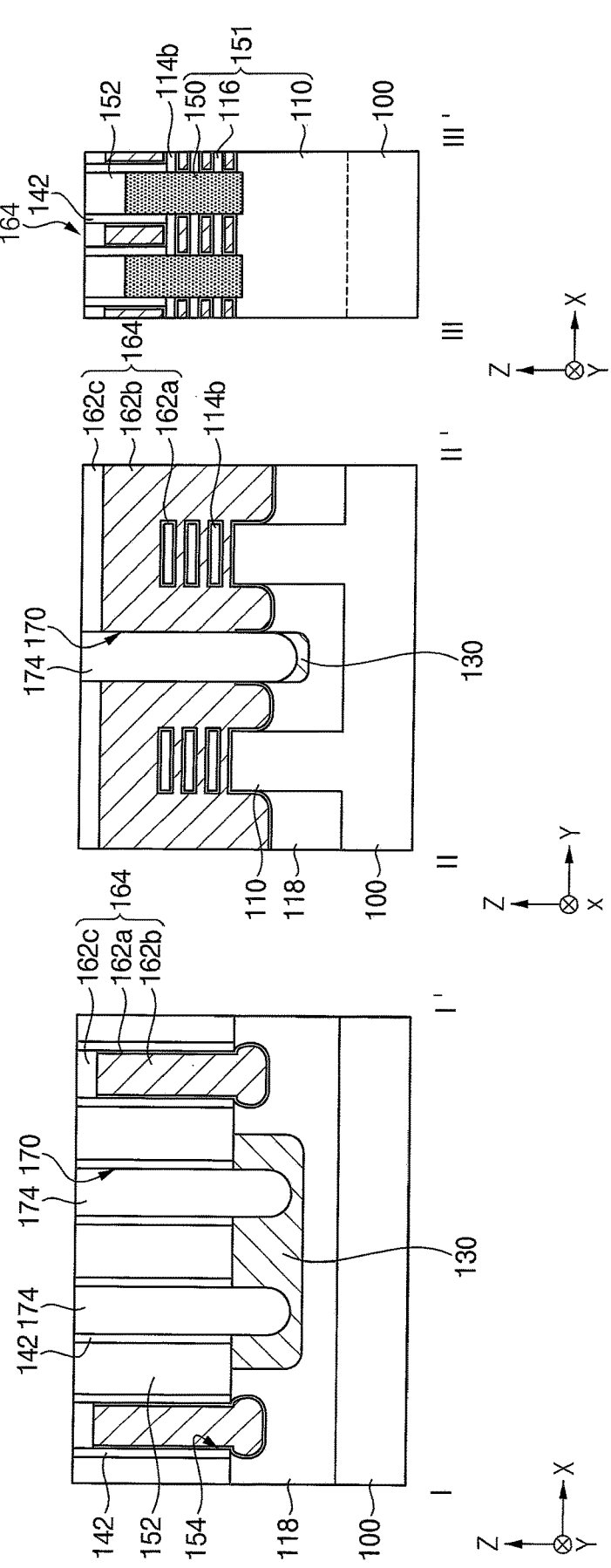

Referring to FIG. 19, an insulation layer may be formed on the gate structure 164 and the first insulating interlayer 152 to fill the fourth opening 170. The insulation layer may be planarized until upper surfaces of the first insulating interlayer 152 and the gate structure 164 may be exposed to form a cutting insulation pattern 174. In example embodiments, the cutting insulation pattern 174 may include, but not limited to, at least one of silicon nitride (SiN) and silicon oxynitride (SiON).

As shown in FIG. 19, the lower portion of the gate structure 164 positioned in the first portion 154a of the gate trench may have an inner width expanding in the horizontal direction(e.g., direction X). The lower portion of the gate structure 164 positioned in the first portion 154a of the gate trench may expand in the vertical direction (e.g., direction Z) and the horizontal direction, so that the lower portion of the gate structure 164 positioned in the first portion 154a of the gate trench may have a convexly rounded shape.

Since the cutting insulation pattern 174 may be formed in the fourth opening 170, a surface profile of the cutting insulation pattern 174 may be the same as a surface profile of the fourth opening 170. Alternatively or additionally, a lower portion of the cutting insulation pattern 174 may have a shape different from a shape of the lower portion of the gate structure 164. The lower portion of the cutting insulation pattern 174 may have a sidewall profile different from that of the lower portion of the gate structure 164. The lower portion of the cutting insulation pattern 174 may have a sidewall slope in which an inner width decreases downward. In some embodiments, a lower portion of the cutting insulation pattern 174 may have a vertical sidewall slope.

A multi-bridge channel field effect transistor may be manufactured by the above processes. In the multi-bridge channel field effect transistor, a bridge defect between gate structures caused by the remaining conductive materials in the fourth opening may be decreased.

According to slight difference of the processes, each of the cutting insulation pattern, the lower impurity region and the gate structure may have slightly different shape. Hereinafter, embodiments having a cutting insulation pattern, a lower impurity region, and/or a gate structure having slightly different shapes may be described.

Figure 20:
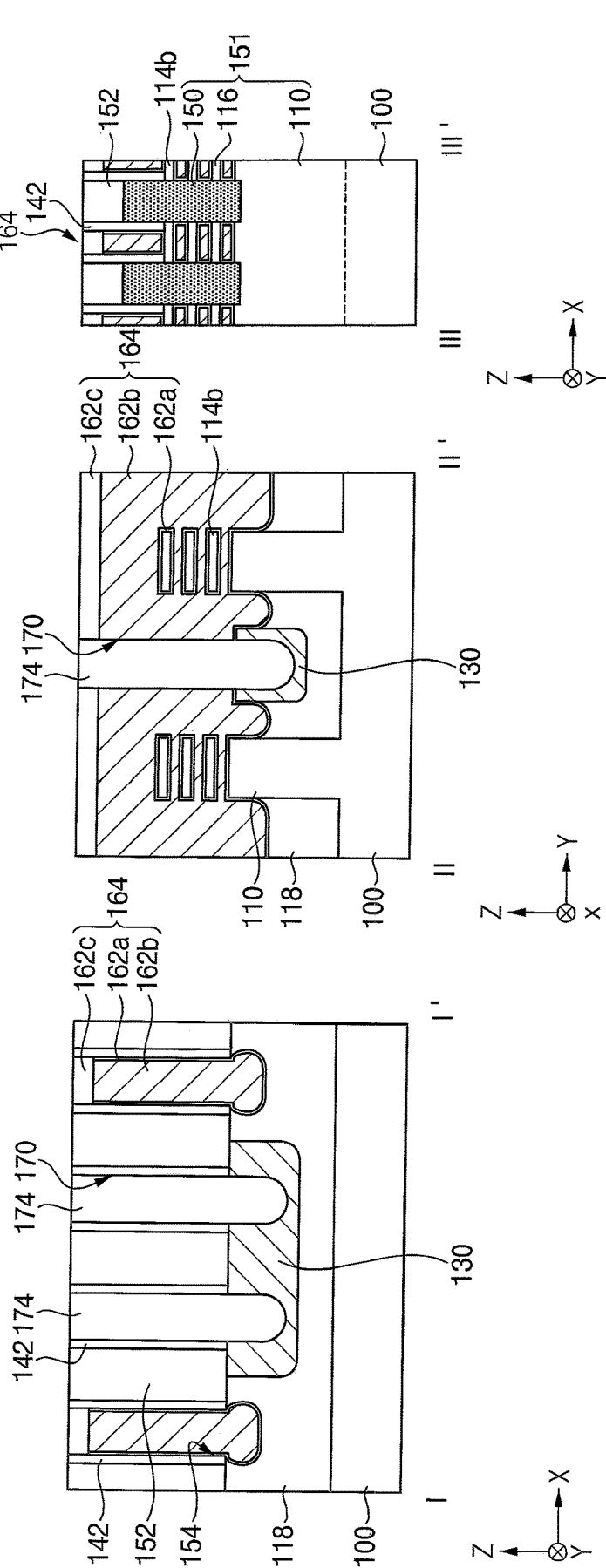
FIG. 20 is a cross-sectional view of a semiconductor device, in accordance with example embodiments.

FIG. 20 is a cross-sectional view of a semiconductor device in accordance with example embodiments.

A semiconductor device illustrated in FIG. 20 may be substantially the same as and/or include the semiconductor devices illustrated in FIGS. 1 and 2, and may include additional features not mentioned above. For example, the semiconductor device illustrated in FIG. 20 differ from the semiconductor devices shown in FIGS. 1 and 2 in a cutting insulation pattern, a lower impurity region, and a gate structure.

Referring to FIG. 20, a width of the lower impurity region 130 in the second direction (e.g., direction Y) may be greater than a width of the lower portion of the cutting insulation pattern 174 in the second direction (e.g., direction Y).

An end portion of the gate structure 164 in the second direction (e.g., direction Y) may be positioned on the lower impurity region 130. For example, a bottom of the end portion of the gate structure 164 in the second direction (e.g., direction Y) may be higher than a bottom of the other portions of the gate structure 164.

In some embodiments, a bottom of the cutting insulation pattern 174 may be lower than a bottom of the gate structure 164 positioned on the isolation pattern 118. In example embodiments, a bottom of the cutting insulation pattern 174 may be higher than a bottom of the lower impurity region 130.

A lower sidewall and a bottom of the cutting insulation pattern 174 may be surrounded by the lower impurity region 130. The lower sidewall and the bottom of the cutting insulation pattern 174 may contact the lower impurity region 130.

The semiconductor device shown in FIG. 20 may be formed by the same and/or similar process as the process described with reference to FIGS. 5 to 19, and may include additional features not mentioned above. For example, in the process described with reference to FIG. 7, the lower impurity region may be formed to have a width greater than a width of the lower portion of the cutting insulation pattern. As diffusion of impurities included in the lower impurity region may be controlled, the width of the lower impurity region may be controlled.

Figure 21:
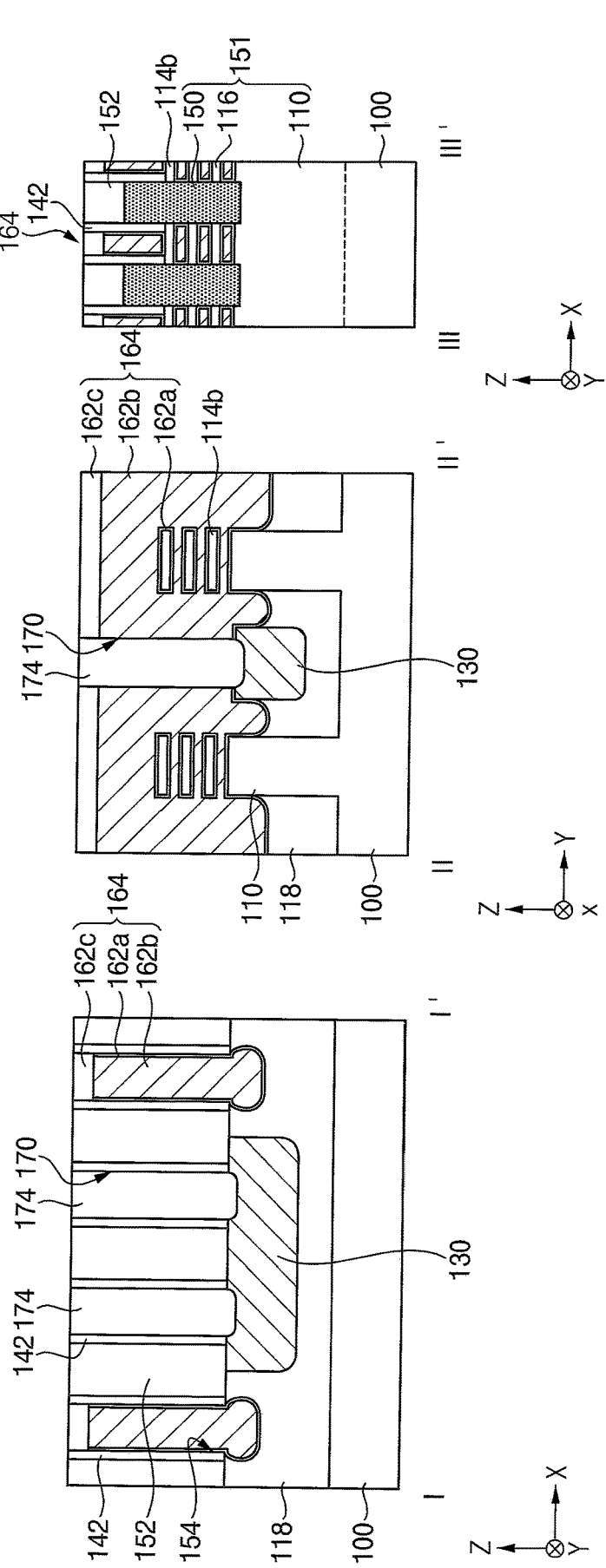
FIG. 21 is a cross-sectional view of a semiconductor device, in accordance with example embodiments.

FIG. 21 is a cross-sectional view of a semiconductor device in accordance with example embodiments.

A semiconductor device illustrated in FIG. 21 may be substantially the same as and/or include the semiconductor device illustrated in FIG. 4, and may include additional features not mentioned above. For example, the semiconductor device illustrated in FIG. 21 may be the same as from the semiconductor device illustrated in FIG. 4 except for a cutting insulation pattern, a lower impurity region, and a gate structure.

Referring to FIG. 21, a width in the second direction (e.g., direction Y) of the lower impurity region 130 may be greater than a width in the second direction (e.g., direction Y) under the cutting insulation pattern 174.

An end portion of the gate structure 164 in the second direction (e.g., direction Y) may be positioned on the lower impurity region 130. A bottom of the end portion of the gate structure 164 in the second direction (e.g., direction Y) may be higher than a bottom of the other portions of the gate structure 164.

A bottom of the cutting insulation pattern 174 may be higher than the bottom of the gate structure 164 positioned on the isolation pattern 118. In example embodiments, the bottom of the cutting insulation pattern 174 may be higher than a bottom of the lower impurity region 130.

The semiconductor device shown in FIG. 21 may be formed by the same and/or a similar process as the process described with reference to FIG. 4, and may include additional features not mentioned above. For example, in the process of forming the lower impurity region, the lower impurity region may be formed to have a width greater than a width of the lower portion of the cutting insulation pattern.

Figure 22:
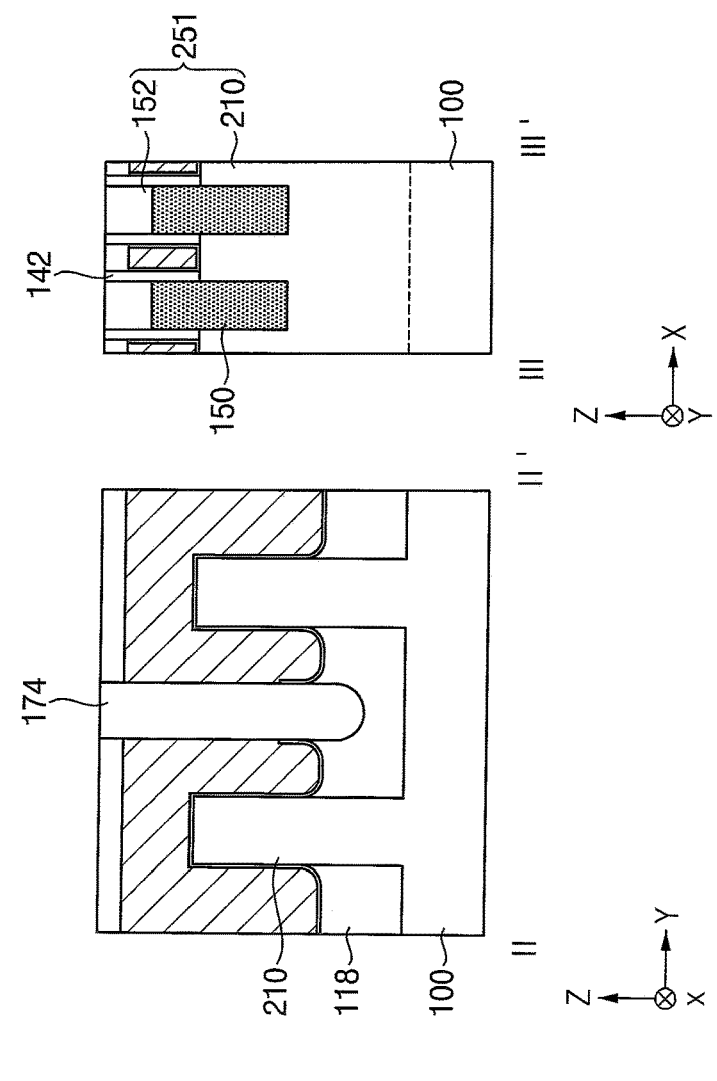
FIGS. 22 and 23 are a cross-sectional view and a plan view illustrating semiconductor devices, in accordance with example embodiments.
Figure 22:
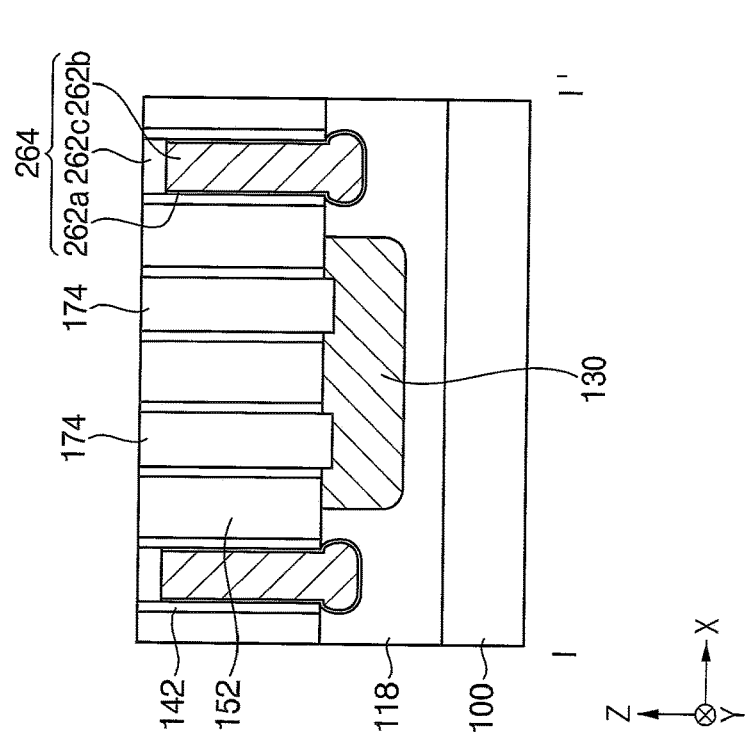
Figure 23:
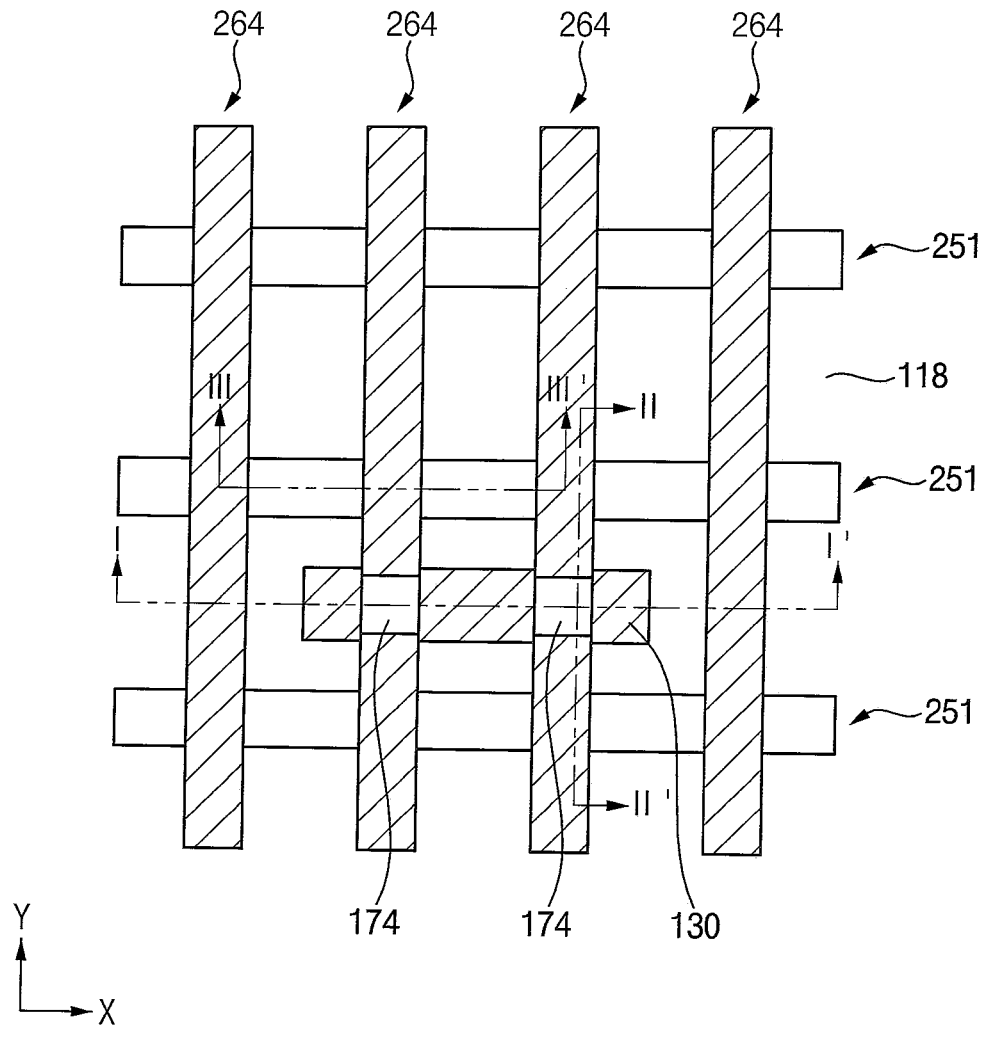

FIGS. 22 and 23 are a cross-sectional view and a plan view illustrating semiconductor devices, in accordance with example embodiments.

FIG. 22 includes cross-sectional views taken along lines I-I', II-II', and III-III' of FIG. 23. The semiconductor device may include a fin field effect transistor.

Referring to FIGS. 22 and 23, the semiconductor device may include an active structure 251 protruding from a substrate 100. The active structure 251 may include an active fin 210 and an impurity region structure 150. The active structures 251 may extend in the first direction (e.g., direction X). A plurality of active structures 251 may be spaced apart from each other in the second direction (e.g., direction Y). The active fin 210 may not include a gap disposed in the vertical direction (e.g., direction Z).

The active fin 210 may be formed by etching a portion of the substrate 100. The active fin 210 may extend in the first direction (e.g., direction X). An isolation pattern 118 may be formed in a lower portion of a trench between the plurality of active fins 210. The isolation pattern 118 may include, but not be limited to, silicon oxide. The isolation pattern 118 may cover a lower sidewall of the active fin 210.

The impurity region structure 150 may be formed on both sides of the active fin 210 in the second direction (e.g., direction Y). The impurity region structure 150 may include, but not be limited to, a semiconductor material.

The gate structure 264 may surround the active fin 210 to cover the active fin 210. The gate structure 264 may extend in the second direction (e.g., direction Y). The gate structure 264 may be formed on the active fin 210 and the isolation pattern 118. The gate structures 264 may include a gate insulation pattern 262a, a gate electrode 262b and a capping pattern 262c.

A lower portion of the gate structure 264 positioned on the isolation pattern 118 may be the same as that described with reference to FIG. 1, and may include additional features not mentioned above. For example, a width of the lower portion of the gate structure 264 may be expanded in the first direction (e.g., direction X). Alternatively or additionally, the lower portion of the gate structure 264 may expand in the horizontal direction, so that the lower portion of the gate structure 264 may have a laterally convexly rounded shape, in a cross-sectional view of the first direction (e.g., direction X).

A lower impurity region 130 may be formed at an upper portion of the isolation pattern 118 in the gate structure cutting region. In example embodiments, impurities doped into the lower impurity region 130 may include, but not be limited to, at least one of silicon (Si), carbon (C), and boron (B).

A first insulating interlayer 152 may be formed on the substrate 100 to cover both sides of the gate structure 264. The plurality of gate structures 264 may be spaced apart from each other in the first direction (e.g., direction X). A cutting insulation pattern 174 may be formed in the fourth opening formed by the gate structures 264 and the first insulating interlayer 152. The gate structures 264 spaced apart in the second direction (e.g., direction Y) may be insulated from each other by the cutting insulation pattern 174.

In example embodiments, a bottom of the cutting insulation pattern 174 may be higher than a bottom of the lower impurity region 130.

A lower portion of the cutting insulation pattern 174 may have a shape different from that of a lower portion of the gate structure 164 on the isolation pattern 118. A lower portion of the cutting insulation pattern 174 may not have an expanding shape in the first direction (e.g., direction X). In example embodiments, a lower portion of the cutting insulation pattern 174 may have a sidewall slope in which an inner width decreases downward. In other optional or additional embodiments, a lower portion of the cutting insulation pattern 174 may have a vertical sidewall slope.

In example embodiments, a bottom of the cutting insulation pattern 174 may be lower than a bottom of the gate structure 164.

In other optional or additional embodiments, a bottom of the cutting insulation pattern 174 may be higher than a bottom of the gate structure 164 positioned on the isolation layer pattern.

In some example embodiments, a bottom of the cutting insulation pattern 174 may be lower than a bottom of the lower impurity region 130.

Figure 24:
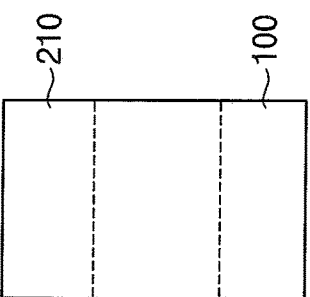
FIGS. 24 and 25 are cross-sectional views illustrating semiconductor devices, in accordance with example embodiments.
Figure 24:
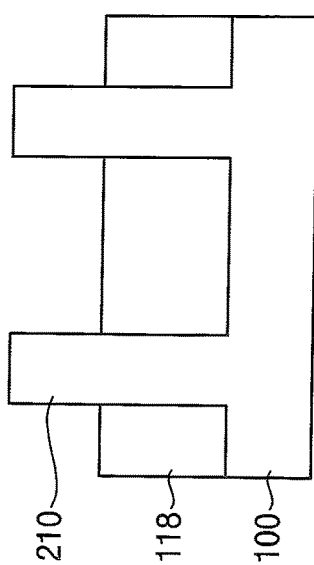
Figure 24:
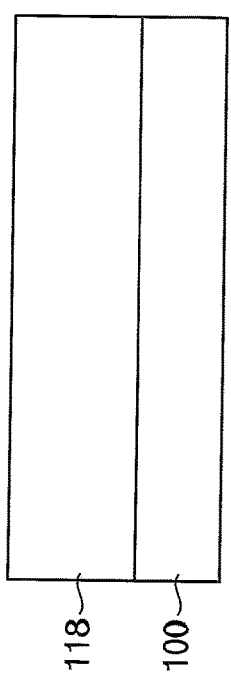
Figure 25:
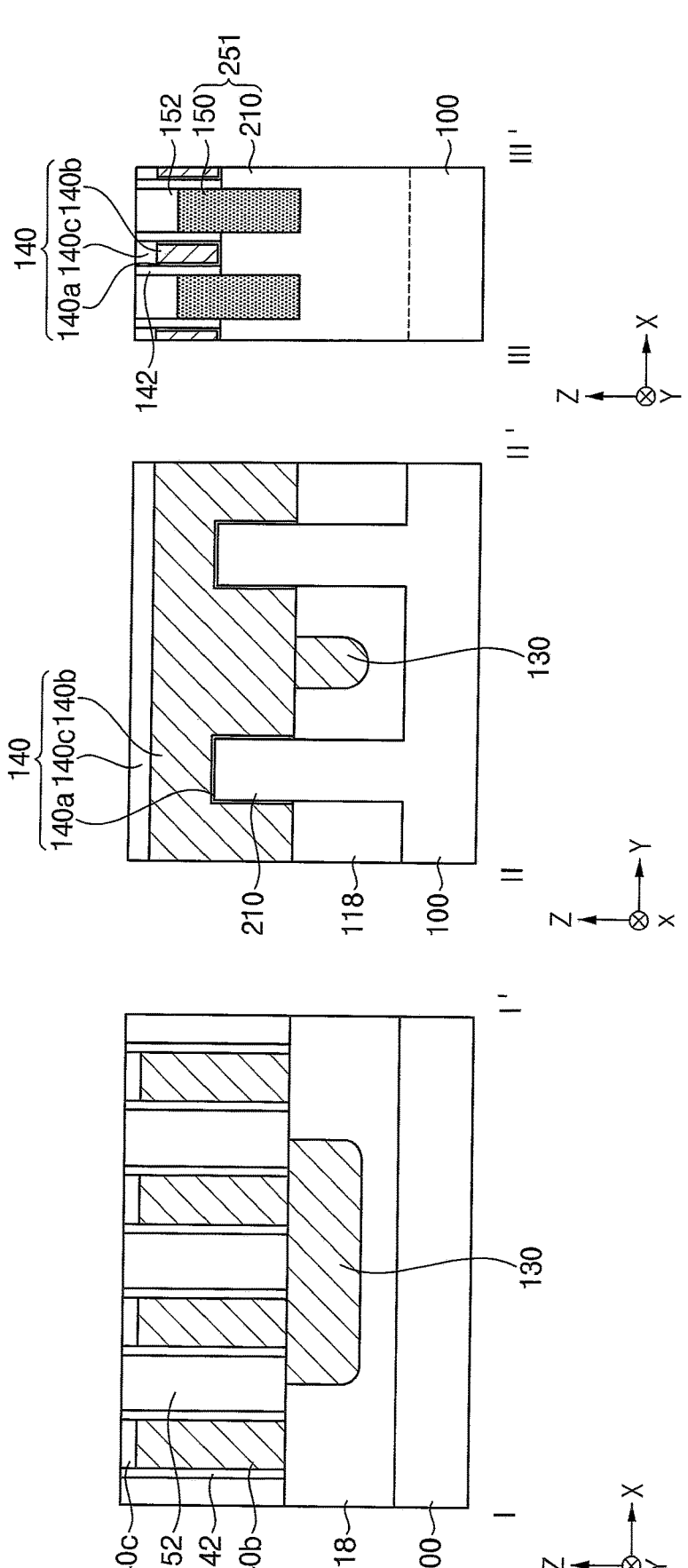

FIGS. 24 and 25 are cross-sectional views illustrating semiconductor devices, in accordance with example embodiments.

FIGS. 24 and 25 include cross-sectional views taken along lines II', II-II', and III-III' of FIG. 23.

Hereinafter, a method of manufacturing a semiconductor device including a fin field effect transistor may be described. A method of manufacturing the semiconductor device may be similar to and/or be the same as that described with reference to FIGS. 5 to 18, and may include additional features not mentioned above. For example, the method of manufacturing a semiconductor device including a fin field effect transistor may be the same as that described with reference to FIGS. 5 to 18 except for processes of forming an active fin.

Referring to FIG. 24, a portion of a substrate 100 may be etched to form an active fin 210. The active fin may protrude from the surface of the substrate 100 in the vertical direction (e.g., direction Z), and may extend in the first direction (e.g., direction X). An isolation pattern 118 may be formed in a lower portion of a trench between the active fins 210. The isolation pattern 118 may cover sidewalls of the active fin 210. The isolation pattern 118 may include, but not be limited to, silicon oxide.

Referring to FIG. 25, the same or similar processes as those described with reference to FIGS. 7 to 11 may be performed to form the lower impurity region 130, the dummy gate structure 140, the spacer 142, the impurity region structure 150 and the first insulating interlayer 152.

Subsequently, the dummy gate structure 140 may be removed to form a gate trench. Thereafter, the same process as described with reference to FIGS. 15 to 19 may be performed. Accordingly, the semiconductor device shown in FIGS. 23 and 24 may be manufactured, and may include additional features not mentioned above.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
active structures extending in a first direction on a substrate;
an isolation pattern formed in a trench between the active structures;
gate structures extending in a second direction across the active structures, the gate structures being formed on the active structures and the isolation pattern, the second direction being perpendicular to the first direction;
a cutting insulation pattern formed between end portions of the gate structures in the second direction; and
a lower impurity region at an upper portion of the isolation pattern, the lower impurity region contacting at least a portion of the cutting insulation pattern,
wherein a first shape of a lower portion of the cutting insulation pattern disposed under an uppermost surface of the isolation pattern is different from a second shape of a lower portion of the gate structures disposed under the uppermost surface of the isolation pattern, and
wherein a first width in the first direction of the lower portion of the gate structures is greater than a second width in the first direction of an upper portion of the gate structures.

2. The semiconductor device of claim 1, wherein the second shape of the lower portion of the gate structures comprises a laterally convexly rounded shape, in a cross-sectional view in the first direction.

3. The semiconductor device of claim 1, wherein the lower portion of the cutting insulation pattern has a sidewall slope; and
wherein the lower portion of the cutting insulation pattern has an inner width that decreases in a downward direction.

4. The semiconductor device of claim 1, wherein a plurality of cutting insulation patterns are disposed on the lower impurity region.

5. The semiconductor device of claim 1, wherein a first level of a bottom of the gate structures disposed on the isolation pattern is lower than a second level of an uppermost surface of the lower impurity region.

6. The semiconductor device of claim 1, wherein a first height of a bottom of the cutting insulation pattern is different from a second height of a bottom of the gate structures disposed on the isolation pattern.

7. The semiconductor device of claim 1, wherein a bottom of the cutting insulation pattern is higher than a bottom of the lower impurity region.

8. The semiconductor device of claim 1, wherein a bottom of the cutting insulation pattern is lower than a bottom of the lower impurity region.

9. The semiconductor device of claim 1, wherein the lower impurity region comprises doping using at least one of silicon, carbon, and boron.

10. The semiconductor device of claim 1, wherein the active structures comprise semiconductor patterns spaced apart from each other in a vertical direction;
  wherein the vertical direction is perpendicular to an upper surface of the substrate; and
  wherein the gate structures surrounds the semiconductor patterns.

11. A semiconductor device, comprising:
  lower active patterns protruding from a surface of a substrate surface, the lower active patterns extending in a first direction;
  a channel structure on each of the lower active patterns, the channel structure comprising semiconductor patterns spaced apart from each other in a vertical direction, the vertical direction being perpendicular to an upper surface of the lower active patterns;
  impurity region structures on each of the lower active patterns, the impurity region structures formed on both sidewalls of the channel structure;
  an isolation pattern formed in a trench between the lower active patterns;
  gate structures on the isolation pattern while surrounding the channel structure, the gate structures extending in a second direction, the second direction being perpendicular to the first direction;
  a cutting insulation pattern formed between end portions of the gate structures in the second direction; and
  a lower impurity region formed at an upper portion of the isolation pattern, the lower impurity region contacting at least a portion of the cutting insulation pattern,
  wherein a bottom of the gate structures disposed on the isolation pattern is lower than an uppermost surface of the lower impurity region,
  wherein a lower portion of the gate structures is disposed under an uppermost surface of the isolation pattern, and
  wherein a first width in the first direction of the lower portion of the gate structures is greater than a second width in the first direction of an upper portion of the gate structures.

12. The semiconductor device of claim 11, wherein a shape of a lower portion of the gate structures disposed under an uppermost surface of the isolation pattern comprises a laterally convexly rounded shape, in a cross-sectional view in the first direction.

13. The semiconductor device of claim 11, wherein a lower portion of the cutting insulation pattern disposed under an uppermost surface of the isolation pattern comprises a sidewall slope; and
  wherein the lower portion of the cutting insulation pattern has an inner width that decreases in a downward direction.

14. The semiconductor device of claim 11, wherein a first height of a bottom of the cutting insulation pattern is different from a second height of a bottom of the gate structures disposed on the isolation pattern.

15. The semiconductor device of claim 11, wherein the lower impurity region comprises doping using at least one of silicon, carbon, and boron.

16. A semiconductor device, comprising:
  active structures extending in a first direction on a substrate;
  an isolation pattern formed in a trench between the active structures;
  gate structures extending in a second direction across the active structures, the gate structures being formed on the active structures and the isolation pattern, the second direction being perpendicular to the first direction; and
  a cutting insulation pattern formed between end portions of the gate structures in the second direction, and extending to an upper portion of the isolation pattern,
  wherein a first shape of a lower portion of the cutting insulation pattern disposed under the uppermost surface of the isolation pattern is different from a second shape of a lower portion of the gate structures disposed on the isolation pattern,
  wherein a bottom of the gate structures disposed on the isolation pattern is lower than an uppermost surface of a lower impurity region, and
  wherein a first width in the first direction of the lower portion of the gate structures is greater than a second width in the first direction of an upper portion of the gate structures.

17. The semiconductor device of claim 16, wherein the lower impurity region is formed at an upper portion of the isolation pattern; and
  wherein the lower impurity region contacts at least a portion of the cutting insulation pattern.

18. The semiconductor device of claim 16, wherein the lower impurity region comprises doping using at least one of silicon, carbon, and boron.

* * * * *